United States Patent
Nishida et al.

[11] Patent Number: 6,144,278
[45] Date of Patent: Nov. 7, 2000

[54] TRANSFORMER ASSEMBLING METHOD, TRANSFORMER, TRANSFORMER-MOUNTED SUBSTRATE, POWER SUPPLY UNIT HAVING TRANSFORMER-MOUNTED SUBSTRATE, AND RECORDING APPARATUS INCLUDING POWER SUPPLY UNIT

[75] Inventors: Hideyuki Nishida; Shunichi Haga, both of Yokohama; Ichiro Shimizu, Mitaka, all of Japan

[73] Assignee: Canon Kabushiki Kaisha, Tokyo, Japan

[21] Appl. No.: 09/022,528

[22] Filed: Feb. 12, 1998

[30]  Foreign Application Priority Data

| Feb. 18, 1997 | [JP] | Japan | 9-033833 |
| Feb. 18, 1997 | [JP] | Japan | 9-033834 |
| Feb. 27, 1997 | [JP] | Japan | 9-043871 |
| Feb. 27, 1997 | [JP] | Japan | 9-043872 |
| Feb. 27, 1997 | [JP] | Japan | 9-043873 |
| Jan. 7, 1998 | [JP] | Japan | 10-001815 |

[51] Int. Cl.⁷ ............................. H01F 27/02; H01F 27/30
[52] U.S. Cl. ............................... 336/92; 336/198; 336/90
[58] Field of Search ........................... 336/96, 90, 198; 29/602.1

[56]  References Cited

U.S. PATENT DOCUMENTS

| 5,028,904 | 7/1991 | Kurano | 336/96 |
| 5,317,300 | 5/1994 | Boesel | 336/96 |

FOREIGN PATENT DOCUMENTS

| 56-066022 | 6/1981 | Japan . |
| 59-046015 | 3/1984 | Japan . |
| 61-158116 | 7/1986 | Japan . |
| 61-220409 | 9/1986 | Japan . |
| 6-096965 | 4/1994 | Japan . |
| 6-163278 | 6/1994 | Japan . |
| 7-300561 | 11/1995 | Japan . |
| 9-214156 | 8/1997 | Japan . |

*Primary Examiner*—Michael L. Gellner
*Assistant Examiner*—Anh Mai
*Attorney, Agent, or Firm*—Fitzpatrick, Cella, Harper & Scinto

[57]  ABSTRACT

A transformer including a bobbin formed by uniting a winding member, which has a primary winding and secondary winding and a bore formed thereon and therein, with a primary winding fixture and secondary winding fixture adjoining the openings of the bore, and a ferromagnetic core having a core portion thereof inserted into the bore and including an enclosure for enclosing the windings is manufactured according to a process including an affixing step of firmly affixing both or either of the primary winding fixture and secondary winding fixture to the ferromagnetic core, an impregnation step of impregnating the transformer with a varnish, and an applying step of applying adhesives. A components-mounted substrate is incorporated in a housing to be immobilized and locked in a direction parallel to the components-mounted surface thereof, in which when an impact load is imposed in a direction substantially orthogonal to the components-mounted surface, the components-mounted substrate is displaced by a given magnitude in order to absorb an impact, and in which a displacement whose magnitude is equal to or larger than the given magnitude is restrained in order to disperse the load.

16 Claims, 33 Drawing Sheets

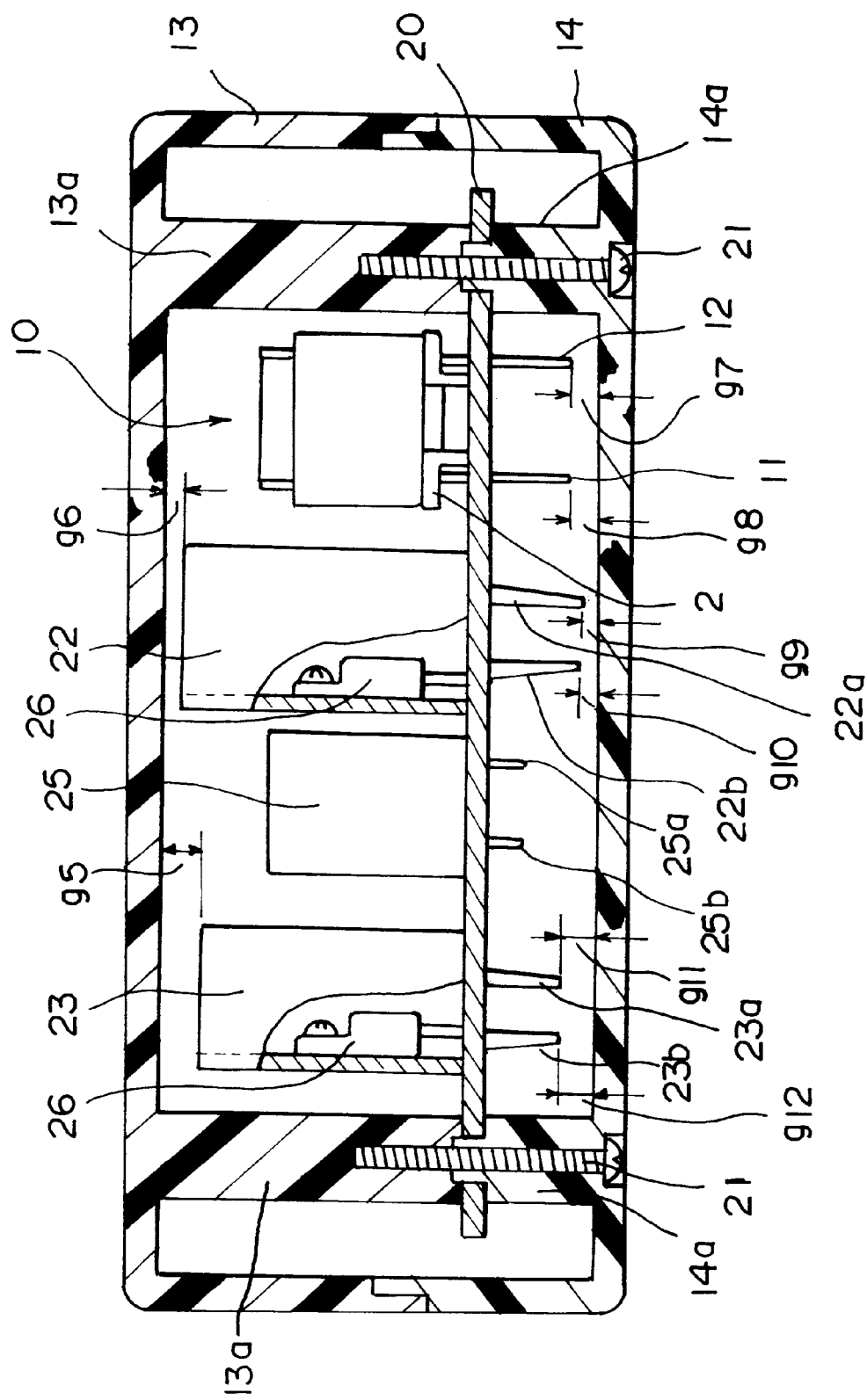

PRIMARY WINDING SIDE  SECONDARY WINDING SIDE

PRIMARY WINDING SIDE  SECONDARY WINDING SIDE

PRIMARY WINDING SIDE          SECONDARY WINDING SIDE

PRIMARY WINDING SIDE          SECONDARY WINDING SIDE

PRIMARY WINDING SIDE     SECONDARY WINDING SIDE

PRIMARY WINDING SIDE    SECONDARY WINDING SIDE

PRIMARY WINDING SIDE   SECONDARY WINDING SIDE

PRIMARY WINDING SIDE   SECONDARY WINDING SIDE

PRIMARY WINDING SIDE   SECONDARY WINDING SIDE

PRIMARY WINDING SIDE   SECONDARY WINDING SIDE

PRIMARY WINDING SIDE   SECONDARY WINDING SIDE

PRIMARY WINDING SIDE    SECONDARY WINDING SIDE

PRIMARY WINDING SIDE    SECONDARY WINDING SIDE

PRIMARY WINDING SIDE    SECONDARY WINDING SIDE

PRIMARY WINDING SIDE   SECONDARY WINDING SIDE

PRIMARY WINDING SIDE   SECONDARY WINDING SIDE

PRIMARY
WINDING SIDE

SECONDARY
WINDING SIDE

TRANSFORMER ASSEMBLING METHOD, TRANSFORMER, TRANSFORMER-MOUNTED SUBSTRATE, POWER SUPPLY UNIT HAVING TRANSFORMER-MOUNTED SUBSTRATE, AND RECORDING APPARATUS INCLUDING POWER SUPPLY UNIT

BACKGROUND OF THE INVENTION

The present invention relates to a transformer assembling method, a transformer, and a transformer-mounted substrate, or to an art most preferably applicable to, for example, a transformer for switching power supply units using a ferrite core. More particularly, this invention is concerned with a power supply unit having a components-mounted substrate or a power supply unit included in a recording apparatus, for example, an AC adaptor used as a power supply for electronic equipment or a power supply unit connected to the AC adaptor.

In general, a switching power supply unit can be designed to be more compact and lightweight than a dropper power supply unit, and has the advantage of exhibiting high conversion efficiency. The switching power supply unit is therefore widely adopted for various usages ranging from the usage as a built-in power supply to be incorporated in a compact equipment to the usage as an AC adaptor. Since the switching power supply unit has thus prevailed, various kinds of electronic equipment that are compact and lightweight can be readily carried about with females or children. The contribution of the switching power supply unit to industries has been highly appreciated.

Referring to the drawings, a transformer to be mounted on a substrate for this kind of switching power supply unit will be described briefly. In the front view of FIG. 46, a coil 103 is formed on a bobbin 102, and a core 101 is inserted into the bore of the bobbin 102a. Thereafter, as shown in FIG. 47, an adhesive is applied to illustrated regions or the transformer is impregnated with a varnish as shown in FIG. 48. Thus, a finished good is completed.

Using the above components, the transformer 100 is designed to be relatively flat, and mounted on a substrate. Thus, the transformer contributes to a compact and lightweight design of a power supply.

However, when the transformer 100 designed to be compact and lightweight and mounted on a substrate is incorporated in a power supply unit, there arises a problem that it may incur an excessive impact load because of improper handling during transportation.

Moreover, when the transformer 100 designed to be compact and lightweight and mounted on a substrate is incorporated in a power supply to be used as an AC adaptor placed on a desktop, since a power cord may be hooked to cause such an event that the power supply falls off the desktop, unprecedented measures must be taken in order to enable the power supply to resist an excessive impact load.

As already known, when an impact load works in this way, the excessive impact load is concentrated on the transformer whose weight is larger than the other various electronic components of the power supply.

The broken state of a transformer is serious when an external force works, as shown in FIG. 43, on a components-mounted substrate 20 in a direction of an arrow F. In other words, when an external force works, a moment oriented in a direction of an arrow M works on a transformer 100. A tensile force acts abruptly on one of thin parts 102a of the bobbin 102 firmly soldered to the pattern-printed area of the substrate 20 via lead pins 12 connected to the secondary winding of the transformer 100. As a result, as already known, a breakdown phenomenon or a phenomenon that a transformer is ruptured at the thin part 102a thereof takes place.

A countermeasure against the rupture is such that the thin parts 102a united with both ends of the coil 103 formed on the bobbin are, as shown in FIG. 44A that is the front view of the bobbin 102 and FIG. 44B that is the right-hand side view of the bobbin, chamfered for the purpose of reinforcement. The anti-breakdown strength of the bobbin 102 is thus improved.

Another fixing method proposed is, as disclosed in Japanese Unexamined Patent Publication Nos. 6-96965 and 6-163278, such that a transformer itself is stowed in a housing for holding the whose transformer and gaps are filled with a resin.

Moreover, according to Japanese Unexamined Patent Publication No. 9-214156, ribs are interposed between radiating plates that are components to be mounted on a substrate. Even when the substrate is dropped, the ribs prevent the substrate from deforming to an extent exceeding a limit. The anti-impact resistivity of the substrate is thus improved.

Furthermore, in many cases, a containing means included in a power supply unit is composed of an upper case and lower case which are separated from each other up and down with a substrate between them. Supporting members are extended from the upper case and lower case in order to immobilize the substrate horizontally and vertically.

The sectional view of FIG. 45 shows an example of a known holding structure for a substrate. There are shown upper and lower cases 213 and 214 for an AC adaptor, a substrate 220 to be held by the cases, screws 221 for tightening the upper case 213 and lower case 214, a transformer 100, radiating plates 222 and 223, and an aluminum electrolytic capacitor 225. On each radiating plate, heat-dissipation components, for example, a power transistor, FET, and diode are fixed using screws.

Ribs 213b that are supporting members successively extending from the upper case 213 are abutting on the substrate 220 and thus locking it. Ribs 214b are successively formed on the lower case 214, and abutting on and holding the bottom of the substrate 220. This helps the substrate 220 resist an impact load including a drop, and prevents deformation-based breakdown of the substrate 20.

However, according to the known structure shown in FIG. 45, many members such as the ribs must be formed inside the cases in order to prevent deformation of the substrate 20 as greatly as possible.

Furthermore, in many cases, a containing means of a power supply unit is composed of an upper case and lower case that are separated from each other up and down with a substrate between them. Supporting members are extended from the upper case and lower case in order to immobilize the substrate horizontally and vertically.

Referring to the drawings, a transformer to be mounted on a substrate for a switching power supply will be reiterated. FIG. 46 is a sectional view showing a major portion of a transformer 100 that has been generally adopted in the past. The transformer and a core are impregnated with a varnish and thus secured. In this drawing, a coil 103 is formed on a bobbin 102, and a core 101 is inserted into the bore of the bobbin 102. Thereafter, adhesives 105 and 106 are applied to illustrated regions. This results in a finished good. In FIG. 48, the whole outer circumference of the transformer is coated with a varnish 108, whereby a finished good is completed.

In the above structures, the transformer 100 is placed to be relatively flat and then mounted on a substrate. The transformer contributes to a compact and lightweight design of a power supply.

Next, a transformer to be mounted on a substrate for a switching power supply unit will be described briefly. FIGS. 47 and 48 are oblique views of the appearance of a transformer 100 that has generally been adopted in the past. FIG. 47 shows a transformer of a type having a core secured using adhesives, and FIG. 48 shows a transformer of a type having a core secured using a varnish with which the transformer is impregnated.

In FIG. 47, a coil 103 is formed on a bobbin 102, and a core 101 is inserted into the bore of the bobbin 102. Thereafter, adhesives 105 and 106 are applied to illustrated regions in order to secure the core, whereby a finished good is completed. In FIG. 48, the whole outer circumference of the transformer is coated with a varnish 108, whereby a finished good is completed.

Whichever of the structures is adopted, the transformer 100 is designed to be relatively flat and then mounted on a substrate. The structure constitutes to a compact and lightweight design of a power supply.

However, there is a problem that after the transformer 100 shown in FIG. 46, 47, or 48 is designed to be compact and lightweight and then mounted on a substrate, when the substrate is incorporated in a power supply unit, the substrate may incur an excessive impact load because of improper handling during transportation.

When a power supply including the transformer 100 designed to be compact and lightweight and mounted on a substrate is used as an AC adaptor placed on a desktop, a power cord may be hooked to cause such an event that the power supply falls off the desktop. This makes it necessary to take unprecedented measures.

As already known, when an impact load thus works, an excessive impact load is concentrated on the transformer, which is heavier than the other various electronic components of the power supply unit.

The broken state of a transformer is serious when an external force works, as shown in FIG. 43, on a components-mounted substrate 20 in a direction of an arrow F. In other words, when an external force works, a moment oriented in a direction of an arrow M acts on the transformer 100. At this time, a tensile force is applied abruptly to one of thin parts 102a of the bobbin 102 fixed to a pattern-printed area of the substrate 20 by way of lead pins 11 and 12 of the transformer 100. As a result, a breakdown phenomenon or a phenomenon that a transformer is ruptured at the thin part 102a takes place.

A countermeasure against the rupture is such that the thin parts 102a united with both ends of the coil 103 formed on the bobbin are chamfered for the purpose of reinforcement. The anti-breakdown strength of the bobbin 102 is thus improved.

Another fixing method is, as disclosed in Japanese Unexamined Patent Publication No. 6-96965 or 6-163278, such that a transformer itself is stowed in a housing case for holding the whole transformer and gaps are filled with a resin.

However, the method for improving anti-breakdown strength by chamfering the thin parts 102a of the bobbin 102 has a problem that since the precision in outer dimensions of a ferrite core employed greatly differs from one to another, a gap may be created by the side of a ferrite core and the transformer may therefore fail to resist an excessive impact load such as a drop.

Moreover, supposing the whole bobbin 102 were made thicker in order to improve the strength of the bobbin 102 and chamfered sufficiently, an effective window of a large area cannot be defined for the transformer. This poses a problem that the performance of the ferrite core inserted into the bore of the bobbin cannot be exerted fully.

As disclosed in Japanese Unexamined Patent Publication No. 7-300561, a method using a resin, which enjoys high mechanical strength, as a material for a bobbin has been proposed. However, a material usable for the bobbin of a transformer must clear the UL standards and other safety standards stipulated by each nation. The material satisfying these standards costs considerably higher than any known material. From the viewpoint of the use practice in markets, there is a problem that the use of an unprecedented material is accompanied by a great risk.

Furthermore, as described in the Japanese Unexamined Patent Publication Nos. 6-96965 and 6-163278, the method of stowing the whole transformer in a housing case and sealing the housing case with a resin has drawbacks that extra cost is required and that the merit of a compact and lightweight design characterizing a switching power supply unit cannot be fully exerted. By the way, as disclosed in Japanese Unexamined Patent Publication No. 7-300561, a method using a resin, which enjoys high mechanical strength, as a material of a bobbin has been proposed. However, since a material to be made into a bobbin of a transformer must clear the UL standards and other safety standards stipulated by each nation. The material satisfying all the standards costs considerably higher than known materials. From the viewpoint of the use practice in markets, there is a problem that the use of an unprecedented material is accompanied by a great risk.

Furthermore, according to the known structure shown in FIG. 45, many members such as ribs must be formed within the cases in order to restrain the substrate 20 from deforming as greatly as possible.

(a) A change in thickness of an upper or lower case and a change in flow of a molding material gets larger to affect the quality of the cases.

(b) The contact state of ribs to a substrate becomes different from one substrate to another because of the uncertainty in precision of the heights of the ribs. Some of the ribs may not work as supporting members. Moreover, when some ribs are jutting out of other ribs and abutting on the substrate, a concentrated stress is applied to the substrate. The applied region of the substrate may crack.

(c) When the number of supporting members that are ribs increases, deformation of a substrate caused by an impact load will be avoided reliably. However, an impact load calculated by multiplying the weights of components mounted on the substrate by an acceleration does not vary at all. The load is therefore concentrated on soldered parts or fixtures for fixing mounted components to the substrate. This poses a problem that a land may be peeled off or a cohesive failure of solder may occur. This trend is outstanding in relation to a heavy transformer.

SUMMARY OF THE INVENTION

The present invention attempts to solve the foregoing problems. An object of the present invention is to provide a transformer assembling method, a transformer, and a transformer-mounted substrate in which the anti-breakdown strength of a transformer can be improved, the performance of a ferrite core can be drawn out fully, and the transformer can be designed to be compact and lightweight. More particularly, an object of the present invention is to provide a transformer capable of being produced to resist a drop according to the on-going process of manufacturing a transformer without the use of any special component or material.

Another object of the present invention is to provide a transformer assembling method, a transformer, and a transformer-mounted substrate in which the anti-breakdown strength of a transformer can be improved, the performance of a ferrite core can be fully drawn out, and the transformer can be designed to be compact and lightweight.

Another object of the present invention is to provide a power supply unit in which when an impact load is applied, a substrate is deformed properly at a large radius of curvature but a stress larger than a breaking stress will not be imposed on mounted components, and a recording apparatus including the power supply unit.

Since a recording apparatus requires a power supply and a main unit of the recording apparatus should be designed compactly and used in common, an AC adaptor is often used as a power supply. For use at offices or on desks, an event that the AC adaptor is dropped because of routing of a cable or the compact design of the AC adaptor often takes place. The present invention also attempts to cope with the event.

The supply voltage for compact electronic equipment including the recording apparatus is different from nation to nation. A power supply unit suitable for a destination to which an equipment is delivered must be included in the equipment. The compact electronic equipment including the recording apparatus often adopt a detachable AC adaptor as a power supply unit due to the easiness in production and management. This is intended to pack an electronic equipment and AC adaptor immediately according to a market trend and then deliver them to a destination. The AC adaptor is not attached to a main unit of the equipment but packed together with the main unit.

A user purchases the thus packed product, unpacks it, and attach the AC adaptor to the main unit. At this time, an excessive impact load may be imposed on the AC adaptor because of improper handling of the AC adaptor during transportation. This is an unprecedented problem.

For simplifying management of specifications for overseas versions of recording apparatuses including an ink-jet printer, the present invention attempts to facilitate the common use of a main unit and power supply.

For accomplishing the above objects, a transformer assembling method for producing a transformer by assembling a bobbin formed by uniting a winding member, which has a primary winding and secondary winding and a bore formed thereon and therein, with a primary winding fixture and secondary winding fixture coupled with the openings of the bore, and a ferromagnetic core having a core portion thereof inserted into the bore and including an enclosure for enclosing the windings is characterized by an affixing step of firmly affixing both or either of the primary winding fixture and secondary winding fixture to the ferromagnetic core using a thermosetting adhesive.

A transformer comprising a bobbin formed by uniting a winding member, which has a primary winding and secondary winding and a bore formed thereon and therein, with a primary winding fixture and secondary winding fixture adjoining the openings of the bore, and a ferromagnetic core having a core portion thereof inserted into the bore and including an enclosure for enclosing the windings is characterized in that a thermosetting adhesive is used to affix firmly both or either of the primary winding fixture and secondary winding fixture to the ferromagnetic core.

Moreover, a transformer-mounted substrate that is a substrate on which a transformer comprising a bobbin formed by uniting a winding member, which has a primary winding and secondary winding and a bore formed thereon and therein, with a primary winding fixture and secondary winding fixture adjoining the openings of the bore in one united body, and a ferromagnetic core having a core portion thereof inserted into the bore and including an enclosure for enclosing the windings is mounted is characterized in that a thermosetting adhesive is used to firmly affix both or either of the primary winding fixture and secondary winding fixture to the ferromagnetic core.

Moreover, a transformer assembling method for producing a transformer by assembling a bobbin formed by uniting a winding member, which has a primary winding and secondary winding and a bore formed thereon and therein, with a primary winding fixture and secondary winding fixture adjoining the openings of the bore, and a ferromagnetic core having a core portion thereof inserted into the bore and including an enclosure for enclosing the windings is characterized by a placement step of placing a basic material used to form an impact absorbent in spaces defined by the primary winding fixture and secondary winding fixture and the ferromagnetic core, and an impregnation step of impregnating the transformer with an impregnation material such as a varnish.

Moreover, a transformer comprising a bobbin formed by uniting a winding member, which has a primary winding and secondary winding and a bore formed thereon and therein, with a primary winding fixture and secondary winding fixture adjoining the openings of the bore, and a ferromagnetic core having a core portion thereof inserted into the bore and including an enclosure for enclosing the windings is characterized in that a basic material used to form an impact absorbent is placed in spaces defined by the primary winding fixture and secondary winding fixture and the ferromagnetic core, and the transformer is impregnated with an impregnation material such as a varnish.

Moreover, a transformer-mounted substrate that is a substrate on which a transformer comprising a bobbin formed by uniting a winding member, which has a primary winding and secondary winding and a bore formed thereon and therein, with a primary winding fixture and secondary winding fixture adjoining the openings of the bore, and a ferromagnetic core having a core portion thereof inserted into the bore and including an enclosure for enclosing the windings is characterized in that a basic material used to form an impact absorbent is placed in spaces defined by the primary winding fixture and secondary winding fixture and the ferromagnetic core, and that the transformer is impregnated with an impregnation material such as a varnish.

Moreover, a transformer assembling method for producing a transformer by assembling a bobbin formed by uniting a winding member, which has a primary winding and secondary winding and a bore formed thereon and therein, with a primary winding fixture and secondary winding fixture adjoining the bore, and a ferromagnetic core having a core portion thereof inserted into the bore is characterized by an affixing step at which a thermoplastic adhesive is used to affix the outer circumferences of the windings opposed to the components-mounted surface of a substrate to the ferromagnetic core, and to affix the primary winding fixture and secondary winding fixture of the bobbin to the ferromagnetic core.

Moreover, a transformer comprising a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore is characterized in that a thermoplastic adhesive is used to affix the outer circumferences of the windings opposed to the components-mounted surface of a substrate to the ferromagnetic core and to affix the primary winding fixture and secondary winding fixture of the bobbin to the ferromagnetic core.

Moreover, a transformer-mounted substrate that is a substrate on which a transformer comprising a bobbin formed by uniting a winding member, which has primary and secondary windings and a bore formed thereon and therein, with a primary winding fixture and secondary winding fixture adjoining the openings of the bore, and a ferromagnetic core having a core portion thereof inserted into the bore is mounted on the components-mounted surface thereof is characterized in that a thermoplastic adhesive is used to affix the outer circumferences of the windings opposed to the components-mounted surface of a substrate to the ferromagnetic core and to affix the primary winding fixture and secondary finding fixture of the bobbin to the ferromagnetic core.

Moreover, a transformer assembling method for producing a transformer by assembling a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore and including an enclosure for enclosing the windings is characterized by an affixing step of affixing the ferromagnetic core to the primary winding fixture and secondary winding fixture.

Moreover, a transformer comprising a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore and including an enclosure for enclosing the windings is characterized in that the ferromagnetic core is affixed to the primary winding fixture and secondary winding fixture.

Moreover, a transformer-mounted substrate that is a substrate on which a transformer comprising a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore and including an enclosure for enclosing the windings is mounted is characterized in that a transformer having the ferromagnetic core affixed to the primary winding fixture and secondary winding fixture is mounted.

Moreover, a transformer assembling method for producing a transformer by assembling a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore and including an enclosure for enclosing the windings is characterized in that at an affixing step of affixing the ferromagnetic core to the primary winding fixture and secondary winding fixture, a first adhesive and second adhesive having mutually different hardness levels are used.

Moreover, a transformer comprising a bobbin formed by uniting a winding member, which has a primary winding and secondary winding and a bore formed thereon and therein, with a primary winding fixture and secondary winding fixture adjoining the bore, and a ferromagnetic core having a core portion thereof inserted into the bore and including an enclosure for enclosing the windings is characterized in that a first adhesive and second adhesive having mutually different hardness levels are used to affix the ferromagnetic core to the primary winding fixture and secondary winding fixture. Moreover, a transformer-mounted substrate that is a substrate on which a transformer comprising a bobbin formed by uniting a winding member, which has primary and secondary windings and a bore formed thereon and therein, with a primary winding fixture and secondary winding fixture adjoining the bore, and a ferromagnetic core having a core portion thereof inserted into the bore and including an enclosure for enclosing the windings is mounted is characterized in that a transformer using a first adhesive and second adhesive having mutually different hardness levels at an affixing step of affixing the ferromagnetic core to the primary winding fixture and secondary winding fixture is mounted.

Moreover, a power supply unit including a components-mounted substrate having a transformer mounted thereon is characterized in which the components-mounted substrate is incorporated in a containing means including locking members for immobilizing and locking the components-mounted substrate in a direction parallel to the components-mounted surface of the components-mounted substrate, and restraining members that when an impact load is imposed in a direction substantially orthogonal to the components-mounted surface, allows the components-mounted substrate to be displaced by a given magnitude and thus absorb an impact, and that restrains a displacement whose magnitude is equal to or larger than the given magnitude so as to disperse the load.

Moreover, a power supply unit including a components-mounted substrate having a transformer mounted thereon is characterized in that the components-mounted substrate is incorporated in a containing means including locking members for immobilizing and locking the components-mounted substrate in a direction parallel to the components-mounted surface of the components-mounted substrate and restraining members that when an impact load is imposed in a direction substantially orthogonal to the components-mounted surface, allows the components-mounted substrate to be displaced by a given magnitude and thus absorb an impact, and that restrains a displacement whose magnitude is equal to or larger than the given magnitude so as to disperse the load, and in that a connecting means is included for making it possible to freely attach or detach the power supply unit to or from a power supply stowage of a recording apparatus and for mechanically and electrically connecting the power supply unit to the power supply stowage.

The present invention is not, needless to say, limited to the aforesaid working modes, but can apply to various working modes restricted to those set forth in the claims.

BRIEF DESCRIPTION OF THE DRAWINGS

FIG. 2 is a sectional view showing a structure in accordance with the second embodiment;

DESCRIPTION OF THE PREFERRED EMBODIMENTS

Preferred embodiments of the present invention will be described with reference to the appended drawings.

Figure 1:
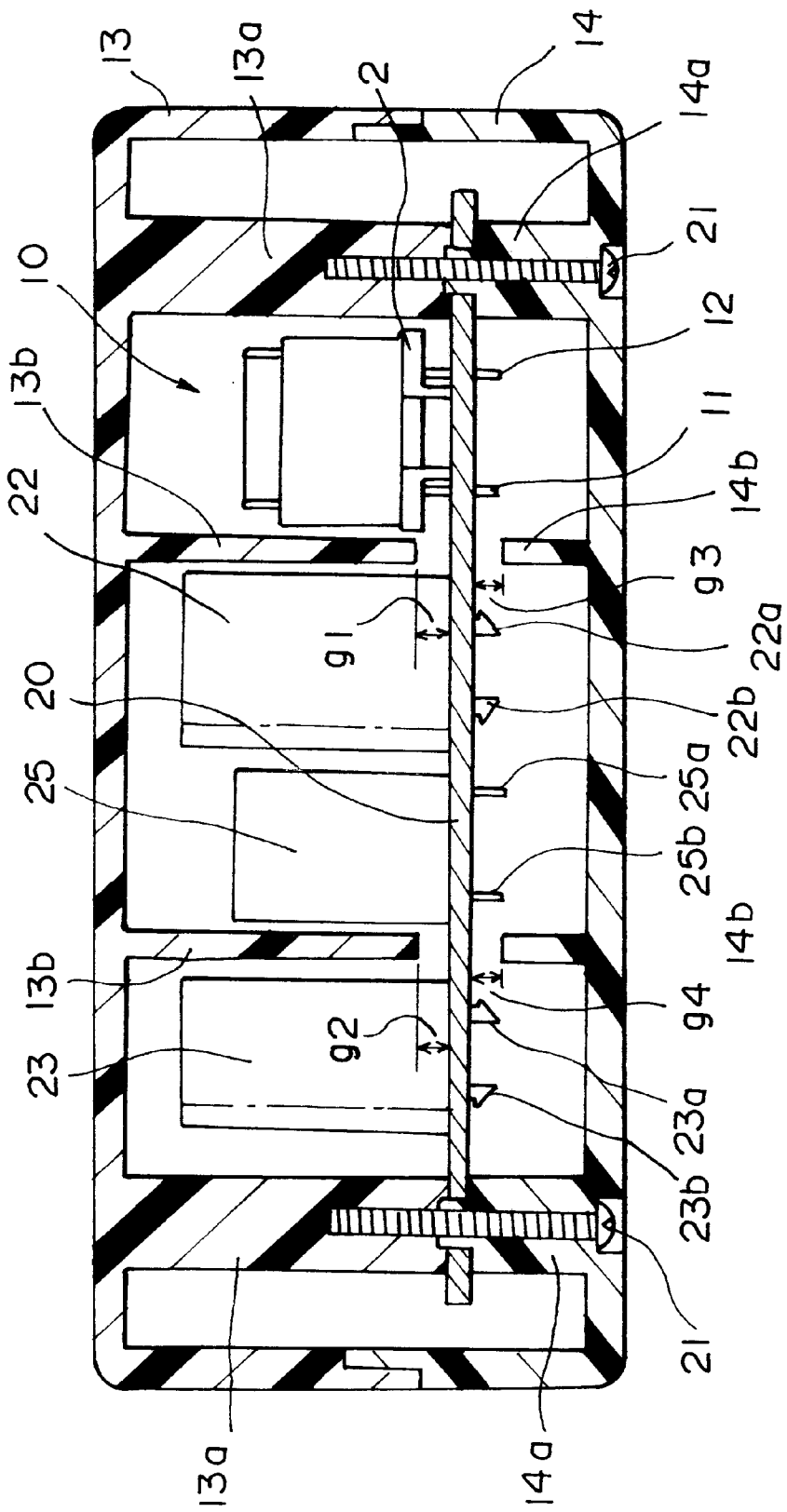
FIG. 1 is a sectional view for explaining a structure for holding a substrate in accordance with the first embodiment of the present invention.

FIG. 1 is a sectional view showing a major portion in accordance with the first embodiment of the present invention. In the drawing, a substrate 20 on which electronic components are mounted is shaped as illustrated by using a given resin material, and used to construct an AC adaptor serving as a power supply unit. Bosses 13a and 14a for screwing upper and lower cases 13 and 14 so as to join the upper and lower cases with the substrate between them are formed as illustrated, whereby the substrate 20 is immobilized and locked horizontally.

Moreover, ribs 13b and 14b serving as stoppers that are restraining members for restricting deformation are molded as parts of the cases, so that an excessive deformation leading to a breakdown can be prevented in case the substrate is deformed by an impact load or the like.

The upper and lower cases 13 and 14 are secured with the substrate 20 between them by tightening screws 21 and thus united with each other. This assembly is handled as a power supply unit and can be replaced with another. A transformer 10 that is heavier than the other mounted components is mounted so that primary winding pins 11 and secondary winding pins 12 are, as illustrated, arranged in the longitudinal direction of the substrate 20.

Moreover, heat-dissipation components, for example, a power transistor, FET, and diode are screwed to radiating plates 22 and 23 mounted on the substrate 20. Moreover, fixing terminals 22a, 22b, 23a, and 23b are inserted into though holes bored in the substrate 20 and then firmly soldered to patterned lands. Thus, mechanical strength is ensured. An aluminum electrolytic capacitor 25 is mounted between the radiating plates 22 and 23 by soldering leads 25a and 25b as illustrated.

In the above example of the structure, the heights of the ends of the ribs from the substrate are determined so that gaps g1, g2, g3, and g4 can be, as illustrated, defined between the ends of the ribs 13b and 14b and the face and back of the substrate 20.

Owing to the presence of the gaps, when the power supply unit is used as, for example, an AC adaptor as mentioned above, if the power supply unit is accidentally dropped and therefore undergoes an impact load, the substrate 20 may be temporarily warped upward in the drawing. Nevertheless, only when the magnitude of displacement corresponds to the gap g1 or g2, the substrate comes into contact with the ribs 13b and is prevented from deforming further. The substrate can therefore be prevented from breaking down.

Moreover, when the AC adaptor undergoes an impact oriented in a direction opposite to the above direction, if the substrate 20 is deformed in the opposite direction, the substrate comes into contact with the ribs 14b serving as stoppers and is prevented from further deforming and breaking down. In this case, the dimensions of the gaps g1, g2, g3, and g4 can be determined freely according to the degree by which the substrate may be deformed. Whatever kind of impact can therefore be coped with. Moreover, the positions of the ribs can be determined optimally in consideration of the positions of components mounted on the substrate.

FIG. 2 is a sectional view showing a major portion in accordance with the second embodiment of the present invention. In the drawing, the same reference numerals are assigned to the components that have already been described. The description of the components will be omitted.

The radiating plates 22 and 23 dissipate heat when a heat-generate component, for example, a power transistor 26 is screwed to them. The heights of the radiating plates from the substrate are determined so that gaps g5 and g6 will be created between the radiating plates and the inner wall surface of the upper case 13. The fixing terminals 22a, 22b, 23a, and 23b used to fix the radiating plates to the substrate 20 are, as illustrated, extending downward. Gaps g7, g8, g9, g10, g11, and g12 are created between the fixing terminals and the inner wall surface of the lower case 14.

Figure 3A:
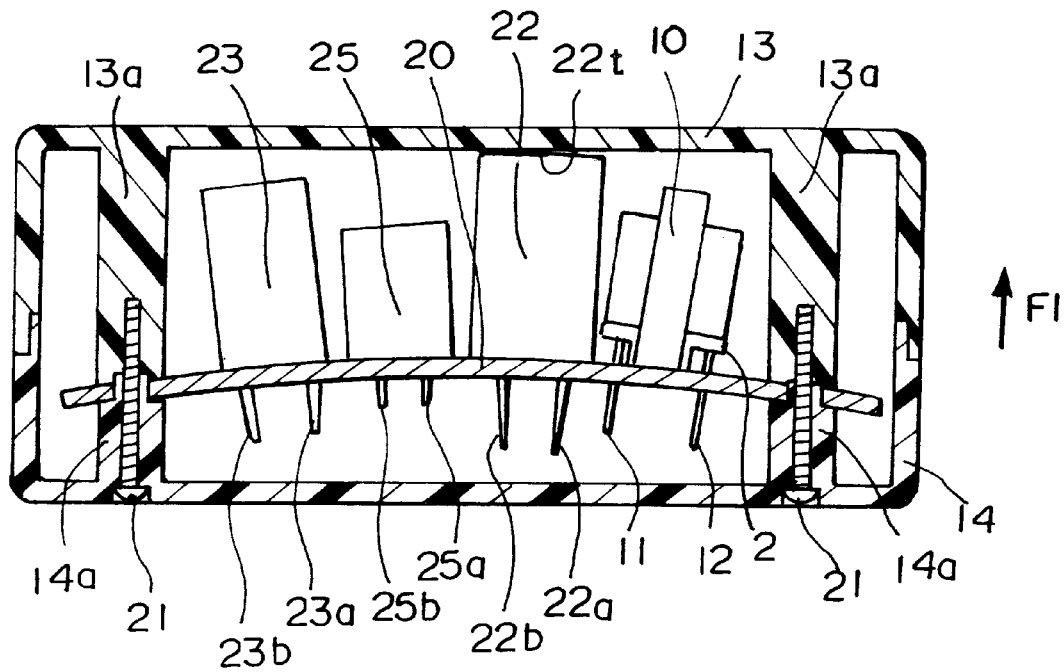
FIGS. 3A and 3B are sectional views showing deformations of a substrate 20 shown in FIG. 2 derived from an impact.
Figure 3B:
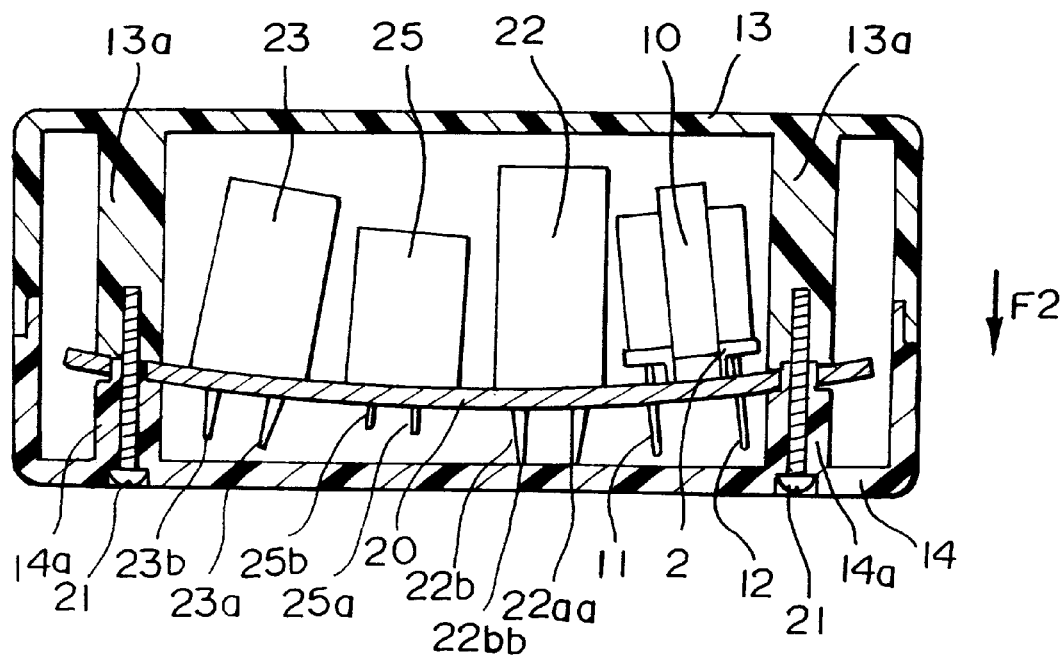

In the foregoing structure, as illustrated in the explanatory diagrams of FIGS. 3A and 3B concerning operations, when an external force works on the AC adaptor in, for example, a direction of an arrow Fl in FIG. 3A, if the substrate 20 is deformed to warp upward in the drawing, an end 22t of the radiating plate 22 abuts on the inner wall of the upper case 13. This prevents the substrate from deforming further.

Referring to FIG. 3B, when an external force works in a direction of an arrow F2, the ends 22aa and 22bb of the fixing terminals 22a and 22b used to fix the radiating plate to the substrate abut on the inner wall of the lower case 14. This prevents the substrate from deforming further. Owing to this structure, the necessity of ribs can be obviated.

Moreover, like the first embodiment, the dimensions of the gaps g5 to g12 can be determined independently according to the degree by which the substrate may be deformed.

Figure 4:
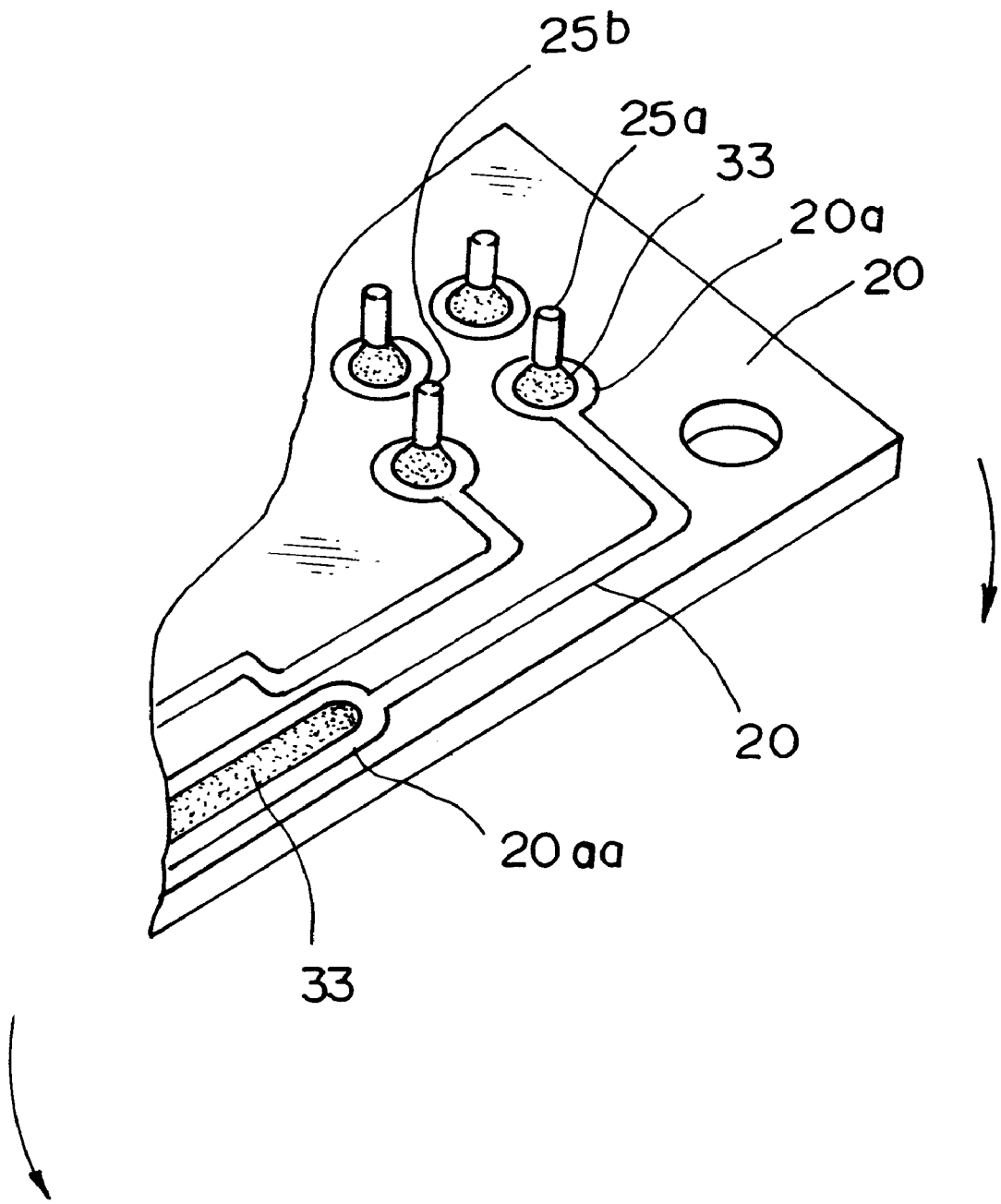
FIG. 4 is an oblique view showing a structure in accordance with the third embodiment.

FIG. 4 is an oblique view showing the third embodiment. In the drawing, there are shown lead terminals 25a and 25b for the aluminum electrolytic capacitor 25, lands 20a for soldering included in a pattern printed on the back of the substrate 20 that is the surface thereof to be soldered, and copper-foil exposed parts 20b not coated with a resist.

In the above structure, the copper-foil exposed parts are coated with solder during flowing or reflowing. The coating helps improve the strength of the surfaces of feeble parts of the substrate. Eventually, the flexural strength of the substrate can be improved partly.

Figure 5:
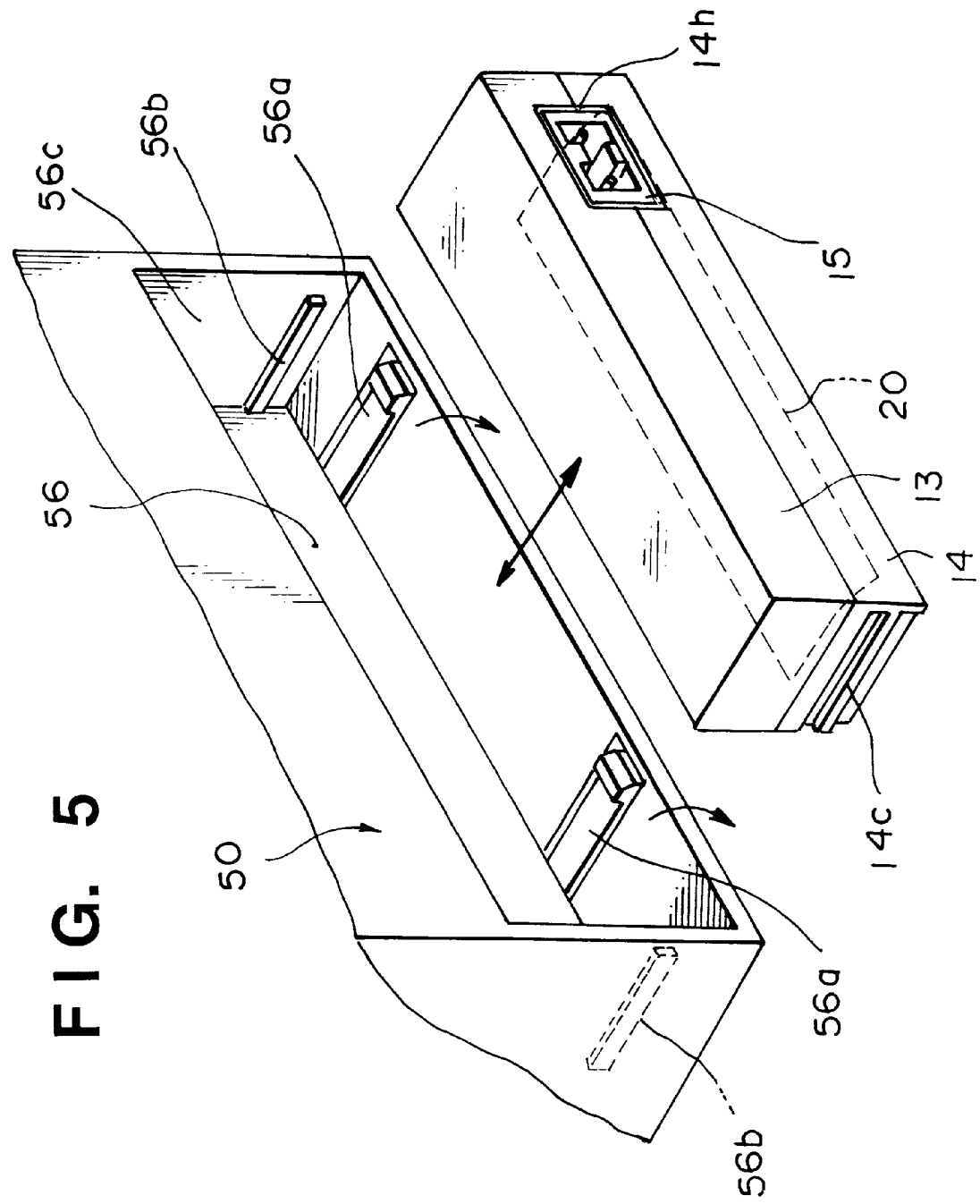
FIG. 5 is an oblique view showing a structure in accordance with the fourth embodiment.
Figure 6:
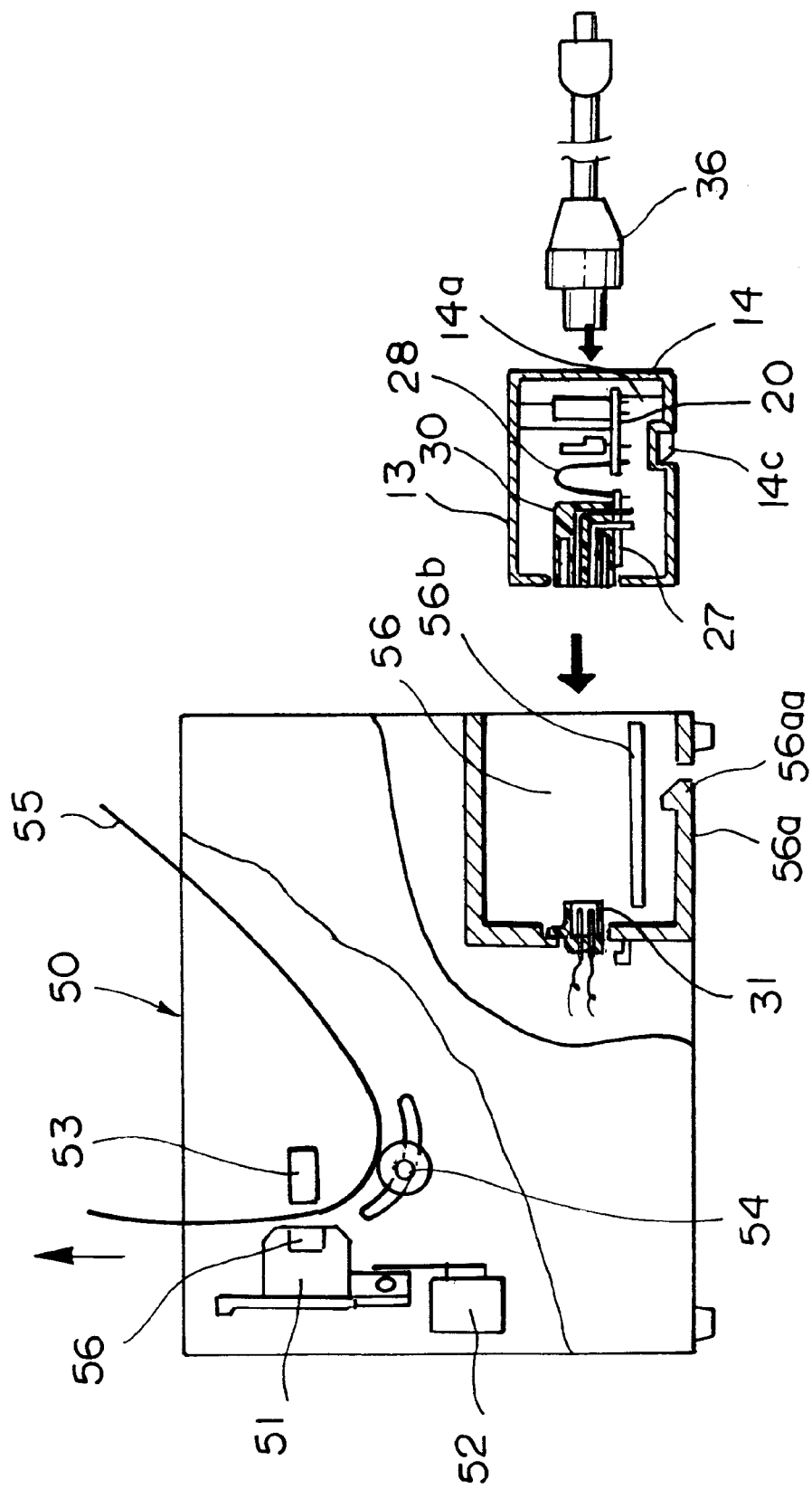
FIG. 6 is a sectional view of the structure shown in FIG. 5.

FIG. 5 is an oblique view showing the fourth embodiment. FIG. 6 is a sectional view of the structure shown in FIG. 5.

In the drawings, the same reference numerals are assigned to the components that have already been described. The description of the components will be omitted. The foregoing transformer is put in a containing means composed of the upper and lower cases 13 and 14. Besides, a sideways elongated substrate 20 indicated with a dashed line is incorporated in the containing means. For enabling this assembly to be replaced with a new one in one united body, a connecting means is included for making it possible to freely attach or detach the assembly to or from a power supply stowage 56 of an ink-jet printer 50 that is a recording apparatus, and for mechanically and electrically connecting the assembly to the power supply stowage.

Owing to the above structure, when an impact load oriented vertically is imposed on the printer 50, the substrate 20 is displaced by a given magnitude in order to absorb the impact. A displacement whose magnitude is equal to or larger than the given magnitude is restrained by the ribs 13b and 14b and others, whereby the impact load is dispersed.

The power supply stowage 56 therefore includes, as illustrated, locking hooks 56a used for mechanical locking the containing means and side guiding projections 56b. A guide ditch 14c is bored in both side surfaces of the power supply unit (AC adaptor), and an opening 14h serving as an inlet 15 is formed in the back of the AC adaptor. An inlet 36 is joined with the inlet 15.

In the above structure, the printer 50 and AC adaptor are mutually separated. For use, however, the printer and AC adaptor are united.

In FIG. 6, concave locking portions 14c are formed in the bottom of the lower case 14 of the AC adaptor. When distal regions 56aa of the locking hooks 56a are fitted into the locking portions, the AC adaptor is locked. In the AC adaptor, a DC connector 30 to be plugged in a socket 31 formed inside the power supply stowage 56 of the printer 50 is mounted on a second substrate 27 connected to the substrate 20 over a power line 28.

In the above structure, talking of the printer 50 and AC adaptor that are mutually separated, when the AC adaptor is inserted into the printer, the projections 56b are fitted into the guide ditches 14c. The hooks 56a is then pressed down by the bottom of the AC adaptor. When the AC adaptor is further inserted, it is locked by the locking portions 14c. In the meantime, the socket 31 of the printer is joined with the connector 30. Thus, power can be supplied from the AC adaptor to the printer. Thereafter, when a cable 36 is plugged into the inlet 15, line connection is completed.

In the above structure, the connecting means is included for making it possible to freely attach or detach the AC adaptor to or from the power supply stowage 56 of the ink-jet printer 50, and for mechanically and electrically connecting the AC adaptor to the power supply stowage. The AC adaptor is therefore freely attachable or detachable. Moreover, the impact load is imposed only on the substrate 20. Since the socket 31 is mechanically separated from the substrate by means of the power line 28, no load is applied to the socket.

As mentioned above, the process of manufacturing a component or transformer will not be modified at all. This is advantageous cost-wise. Products can be managed for each destination and the cost of each product can be reduced because the product is cordless and managing in each destination. Moreover, even when measures must be taken against an impact depending on what components are to be mounted on a substrate, since the contour of a housing is very simple, molding is easy to do. This is especially advantageous when emphasis is put on appearance.

The configuration of an ink-jet printer typical of a recording apparatus in accordance with the present invention will be described briefly. Referring to FIG. 6, a carriage 51 engaged with a screw ditch for a lead screw to be rotated by a driving force conveyer gear responsively to the forward or reverse rotation of a driving motor 52 has a pin (not shown) and is reciprocated over the face and back of paper. The carriage 51 has an ink-jet cartridge 56 mounted thereon. Paper 55 is pressed against a platen 53 by a paper presser along with the movement of the carriage, and driven by a given magnitude by means of a roller 54. Capping, cleaning, and suction and restoration are carried out at associated positions due to the operation of the lead screw when the carriage comes to a home position. Anyhow, the capping, cleaning, and suction and restoration should merely be carried out according to known timing.

In the above structure, when an impact load is imposed on the transformer, the impact load causes the heavy core to impose a force on the bobbin. However, since the core and bobbin of the transformer are coupled with each other over a wide area, a stress is so small that the transformer will not be broken down.

Furthermore, the recording apparatus in accordance with the present invention may be of a type that serves as an image output terminal and that is united with or separated from an information processing equipment such as a computer, a type serving as a copier including a reader or the like, or a type serving as a facsimile system having the transmission and reception functions. As mentioned above, the substrate should merely be designed so that a radius of curvature at a point on the substrate to be observed when the substrate is deformed will be large. When the substrate is held in a narrow space, even if the substrate is deformed little, the radius of curvature becomes small. Therefore, efforts should be made not to hold the substrate in a narrow space.

When a deformation is not restrained at all, it leads to a breakdown. A deformation is therefore restrained by a component other than a substrate which has a restraining function. In this case, since the substrate itself need not be reinforced, the freedom in selecting a material to be made into the substrate expands. In other words, the freedom in selecting a material to be made into the substrate can be maintained and the substrate can be protected from an impact. If the substrate is flexible, it takes some time for the substrate to deform. A load imposed on a soldered area by a component will therefore be dispersed temporally. Eventually, an impact can be alleviated.

Since a recording apparatus requires a power supply, and a main unit of the recording apparatus is requested to be compact and used in common, an AC adaptor is often used as the power supply. Especially, recording apparatuses designed for use at offices or on desks employ the AC adaptor. Under the circumstances, the AC adaptor may be accidentally dropped during routing of a cable or during handling because of the compact design. According to the present invention, such an event can be prevented.

For simplifying management of destinations of an ink-jet printer, a main unit of the printer is requested to be used in common. It is also requested that a power supply can be used in common and an equipment can be handled easily. For meeting these requests, it is considered to make the equipment cordless. Removing a power cord is thought to reduce cost at the same time. From these viewpoints, the main unit, power supply, and cord are supplied separately, and the main unit and power supply are used in common. A printer and power supply suitable for a destination are selected and then assembled by a user. Owing to this system, destinations can be managed easily, and the delivery of an equipment in a cordless state in which the equipment can be handled easily can be realized.

The system will prove advantageous especially when a printer and AC adaptor are assembled by a user. Since the AC adaptor is a separate unit until a user assembles the AC adaptor and printer, the AC adaptor may undergo an impact load such as a drop. The AC adaptor must be protected from the impact load.

An AC adaptor having excellent anti-impact strength can be provided separately from a main equipment such as a recording apparatus or printer. This enables common use of the main unit and AC adaptor. Destinations of products can be managed readily, and products having excellent structures can be provided. When ribs are employed, an AC adaptor having excellent anti-impact strength can be realized without an increase in cost. When components such as radiating plates and a transformer are employed, an AC adaptor having excellent anti-impact strength can be realized without any impairment of the appearance of a housing.

As mentioned above, according to the present invention, there are provided a power supply unit in which when an impact load is applied, a substrate is deformed properly at a large radius of curvature and in which a stress equal to or larger than a breaking stress will not be imposed on mounted components, and a recording apparatus including the power supply unit.

In addition, since a recording apparatus requires a power supply and a main unit of the recording apparatus should be designed compactly and used in common, an AC adaptor is often used as the power supply. For use especially at offices or on desks, the event that the AC adaptor is dropped during routing of a cable or during handling because of the compact design takes place frequently. According to the present invention, precautions can be taken against the event.

For simplifying management of specifications for overseas versions of a recording apparatus such as an ink-jet printer, a main unit of the recording apparatus and a power supply can be used in common.

Figure 7:
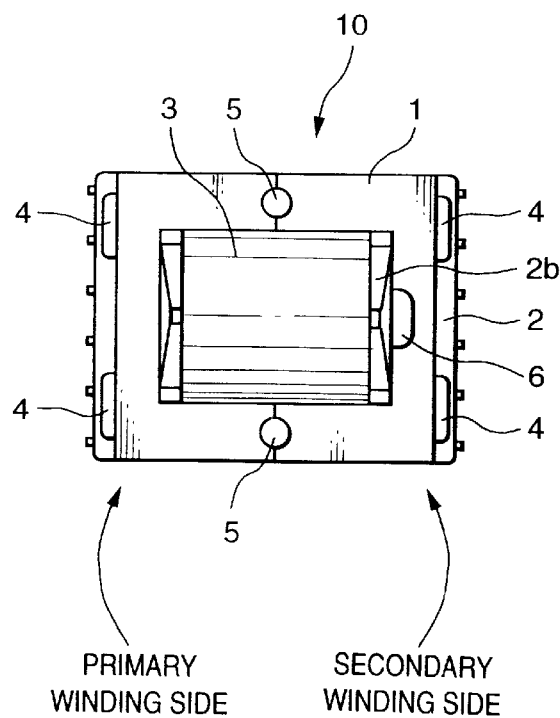
FIG. 7 is a plan view showing the structure of a transformer in accordance with the fifth embodiment.
Figure 8:
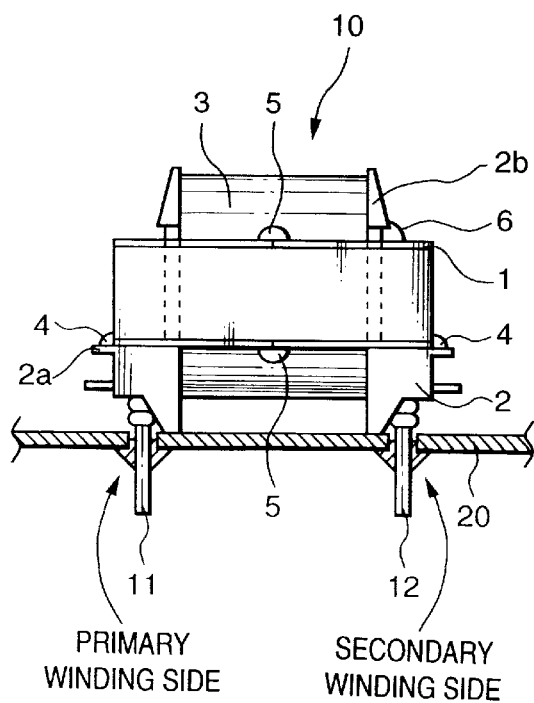
FIG. 8 is a front view of the structure shown in FIG. 7.

Next, FIG. 7 is a plan view showing the structure of a transformer in accordance with the fifth embodiment, and FIG. 8 is a front view of the structure shown in FIG. 7. In FIGS. 7 and 8, the transformer employed in a switching power supply unit is, as illustrated, composed of a core 1 made of a ferrite, a bobbin made of a resin and used to wind a wound material, and a winding member that is a coil made by winding a wound material used to form windings, an inter-layer insulating tape, and a barrier tape used to space the primary and secondary windings in order to meet safety standards according to a given winding method.

An adhesive 4 that is an affixing means for securing the bobbin 2 and core 1 is applied to a total of four regions at the ends of the primary winding and secondary winding on collars 2a of the bobbin 2. An epoxy adhesive that is a thermosetting adhesive is used as the adhesive 4. By contrast, an adhesive 5 is applied to junctions between members constituting the core 1. An adhesive 6 is applied to a junction between an upper end 2b of the bobbin 2 at the end of the secondary winding and the core 1.

The transformer 10 reinforced using the adhesives 4, 5, and 6 is mounted on the substrate 20. Various drop tests were conducted on the transformer in comparison with a transformer whose core 1 and bobbin 2 were not secured. In the known transformer, the core 1 and bobbin 2 were not secured at regions on the margins of the bobbin. The core 1 was thought to crack. However, the thin part 102a shown in FIG. 43 cracked. It was confirmed that a moment M or an excessive impact was concentrated on the transformer, which was relatively heavy, in a direction of an arrow in FIG. 4, the bobbin 2 could not resist the moment or impact and was relatively readily ruptured near the portion of the winding member from which the lead pins are extending. Consequently, it has been revealed that the core 1 has sufficient anti-impact resistivity but the strength of the bobbin 2 is insufficient.

Figure 16:
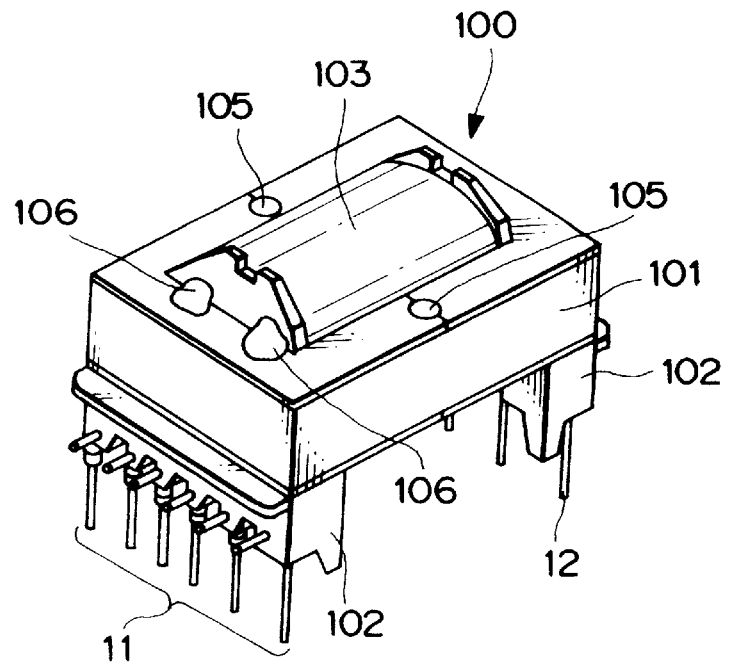
FIG. 16 is an oblique view of a transformer having a known structure.

In the known transformer, an adhesive 106 is applied to one side of a bobbin as shown in FIG. 16. The adhesive 4 that is an epoxy adhesive is, as shown in FIGS. 7 and 8, applied to the four regions on the collars 2a of the bobbin at the ends of the primary winding and secondary winding in order to secure the bobbin 2 and core 1. Thus, the strength of adhesive bonding between the bobbin 2 and core 1 is increased in order to disperse a breaking force applied to the bobbin 2, such as, a moment M or impact load stemming from a drop.

When the transformer 10 having the foregoing structure was dropped off a desktop (approximately 75 cm high) to a floor seven times in the same direction, the transformer did not break down.

According to the foregoing structure, only a little change is requested to be made at a step of applying adhesives in the process of manufacturing a transformer, that is, the number of regions on the collars 2a to which the adhesive 4 is applied should be increased. No special means or material is needed. This is advantageous.

Moreover, the epoxy adhesive that is an affixing means for securing the bobbin 2 and core 1 is a thermosetting adhesive. Natural hardening is facilitated due to heat dissipated during self-heating occurring when the transformer in the power supply unit is actuated. Moreover, the thermosetting adhesive has the merit that since the heat conductivity of the thermosetting adhesive is excellent, the strength of adhesive bonding exhibited by the thermosetting adhesive will, unlike that exhibited by a thermoplastic adhesive, not deteriorate.

Figure 9:
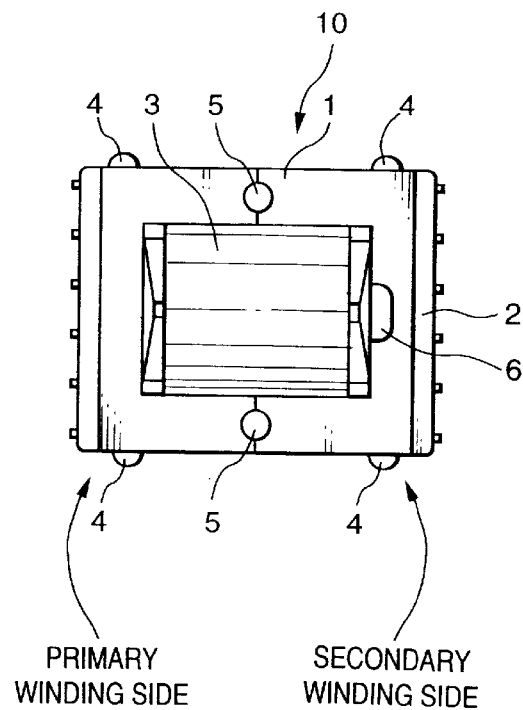
FIG. 9 is a plan view showing the structure of a transformer in accordance with the sixth embodiment.
Figure 10:
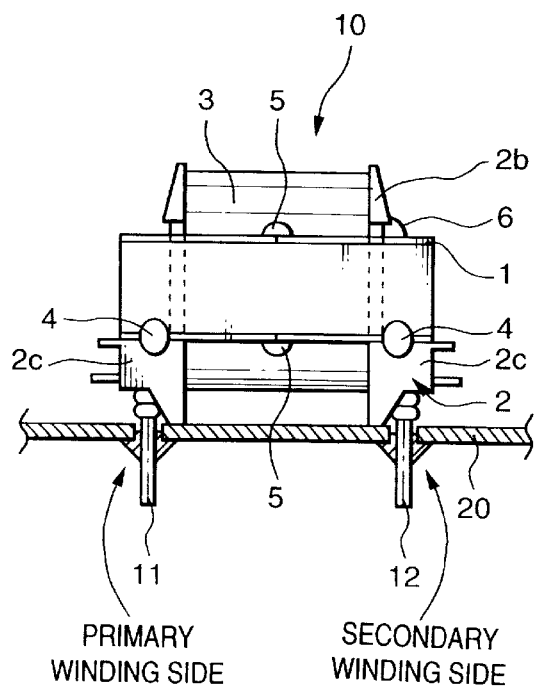
FIG. 10 is a front view of the structure shown in FIG. 9.

In FIG. 9 that is a plan view showing the structure of a transformer in accordance with the sixth embodiment and FIG. 10 that is a front view of the structure shown in FIG. 9, the same reference numerals are assigned to the components that have been described. The description of the components will be omitted, but a difference from the aforesaid embodiments will be described. In the aforesaid embodiment, the adhesive 4 used to secure the bobbin 2 and core 1 is applied to positions on the collars 2a at the ends of the primary winding and secondary winding, that is, the surfaces opposed to the core 1 and in contact with the bobbin 2 which include at least four corners of the bobbin 2.

In the sixth embodiment, as shown in FIGS. 9 and 10, the adhesive 4 used to secure the bobbin 2 and core 1 is applied to positions, which include at least four corners of the bobbin 2, on side surfaces 2c of the bobbin at the ends of the primary winding and secondary winding along lines, along which the core and bobbin are joined with each other, on the outer circumference of the transformer. The positions to which the adhesives 5 and 6 are applied are the same as those in the fifth embodiment.

When the transformer 10 having the above structure was dropped off a desktop (approximately 75 cm high) to a floor seven times in the same direction, the transformer was not broken down. Moreover, only a little change should be made at the step of applying adhesives in the process of manufacturing a transformer, that is, the number of positions on the side surfaces 2c to which the adhesive 4 is applied should merely be increased. No special means or material is needed. This is advantageous.

Figure 11:
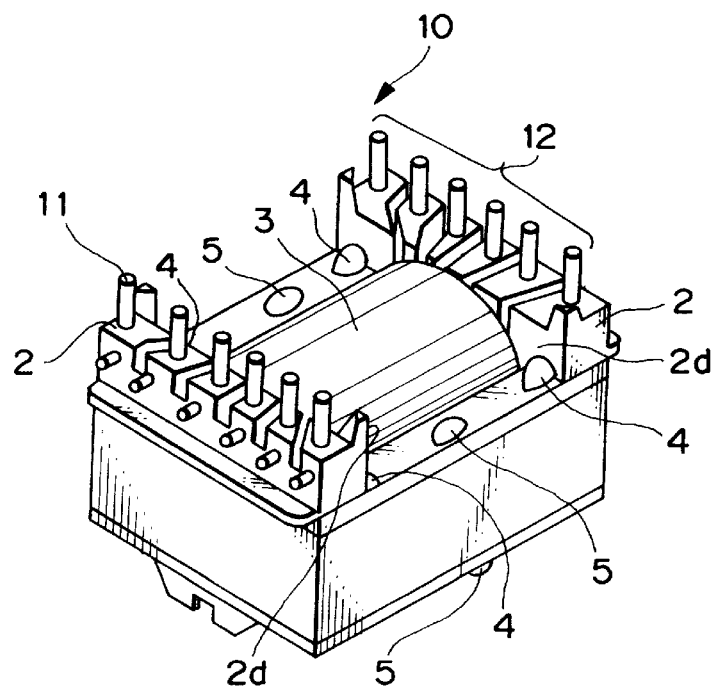
FIG. 11 is an oblique view showing the structure of a transformer in accordance with the seventh embodiment which is seen from the bottom thereof.
Figure 12:
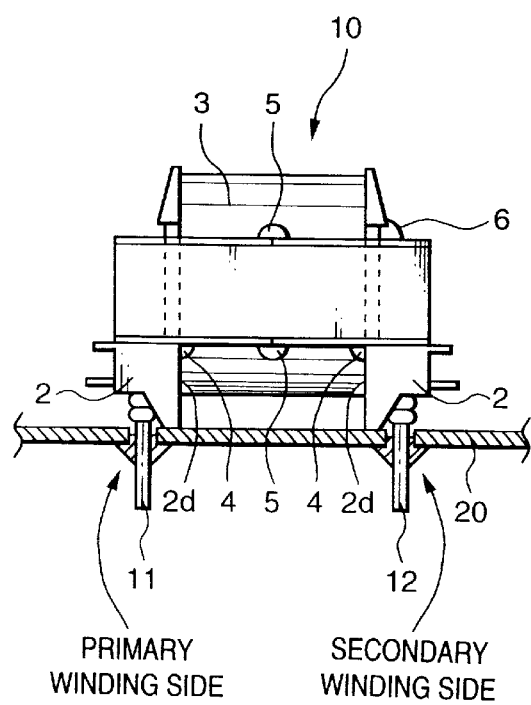
FIG. 12 is a front view of the transformer, which is shown in FIG. 11, mounted on a substrate.

FIG. 11 is an oblique view showing the structure of a transformer 10 in accordance with the seventh embodiment which is seen from the bottom thereof, and FIG. 12 is a front view of the transformer 10, which is shown in FIG. 11, mounted on a substrate.

In FIGS. 11 and 12, the same reference numerals are assigned to the components that have already been described. The description of the components will be omitted. Only a constituent feature will be described. The basic structure of the transformer is identical to those in accordance with the aforesaid embodiments.

A difference lies in a point that the adhesive 4 used to secure the bobbin 2 and core 1 is applied to junctions between surfaces 2d of the primary winding and secondary winding, which are mutually opposed, and the bottom of the core 1. When the transformer is seen from the side thereof opposed to the substrate, the junctions lie on lines along which the bobbin and core are joined with each other and at inner corners of the transformer.

Normally, there is a play between a core and bobbin in terms of dimensions. In this embodiment, when the core and bobbin are assembled and the adhesive 4 is applied, if the assembly is placed upside down, little gaps are created between the bobbin and core due to the weight of the core 1.

The positions to which the adhesive 4 used to secure the bobbin 2 and core 1 is applied correspond to the positions of the gaps, and lie on the surfaces of the primary winding and secondary winding along lines, along which the bobbin and core are joined with each other, at four inner corners of the transformer relative to the side of the transformer opposed to the substrate.

Since the adhesive 4 is applied to the positions, a larger amount of adhesive 4 than the amount of adhesive employed in the aforesaid embodiment can be applied. Moreover, part of the adhesive 4 enters the gaps between the core 1 and bobbin 2. This provides the merit of providing sufficient strength of adhesive bonding.

Figure 13:
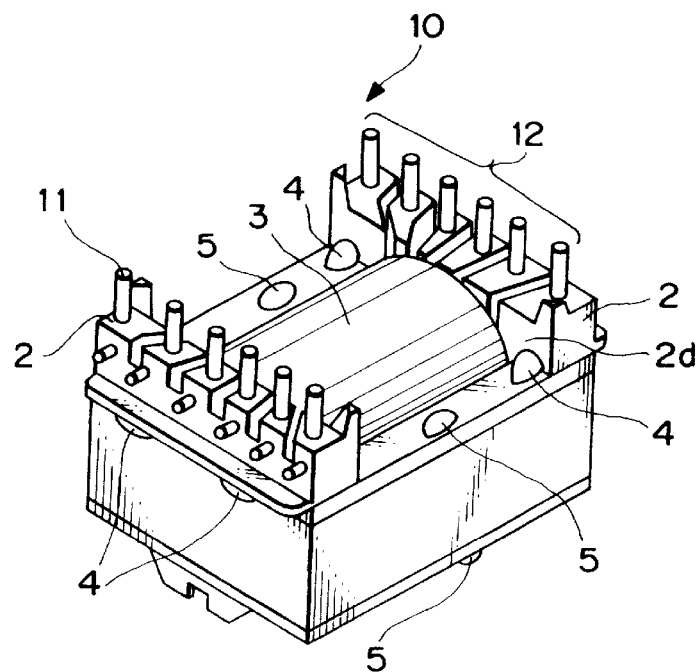
FIG. 13 is an oblique view showing the structure of a transformer in accordance with the eighth embodiment which is seen from the bottom thereof.
Figure 14:
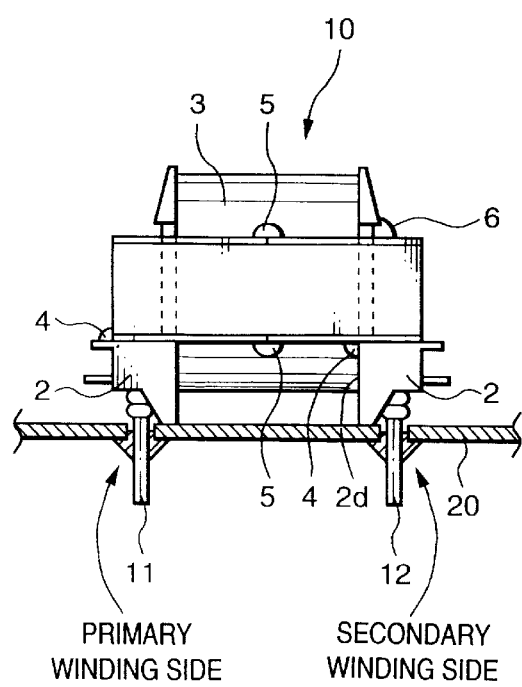
FIG. 14 is a front view of the transformer, which is shown in FIG. 13, is mounted on a substrate.

FIG. 13 is an oblique view showing the structure of a transformer in accordance with the eighth embodiment which is seen from the bottom thereof, and FIG. 14 is a front view of the structure of the transformer, which is shown in FIG. 13, mounted on a substrate.

In the drawings, the same reference numerals are assigned to the components that have already been described. The description of the components will be omitted and only a difference will be described. When the core 1 is fixed to the bobbin 2, the core 1 is aligned with one side of the bobbin. The positions to which the affixing means 4 used to secure the bobbin 2 and core 1 is applied are, as shown in FIGS. 13 and 14, different between the primary winding and secondary winding. The positions relative to one winding to which the affixing means is applied are positions on the surface of the winding opposed to the core and joined with the bobbin which include at least two corners of the bobbin of the transformer. The positions relative to the other winding to which the affixing means is applied are positions along a line, along which the bobbin and core are joined with each other, at two inner corners out of four corners of the transformer defined by the other winding whose outer circumference is not secured. These positions are determined as a compromise of the positions relative to the primary winding and secondary winding to which the affixing means is applied according to the aforesaid embodiments.

This embodiment provides a means that proves more effective when a moment causing a breakdown and stemming from an impact of a drop is deflected.

In FIGS. 13 and 14, when the core is fixed to the bobbin, the core is aligned with one side of the transformer so that the affixing means can be applied to larger areas on the surface opposed to the core and joined with the bobbin which cover at least two corners of the bobbin of the transformer. This brings about the merit that the degree of reinforcement achieved by the adhesive in the regions increases.

Figure 15:
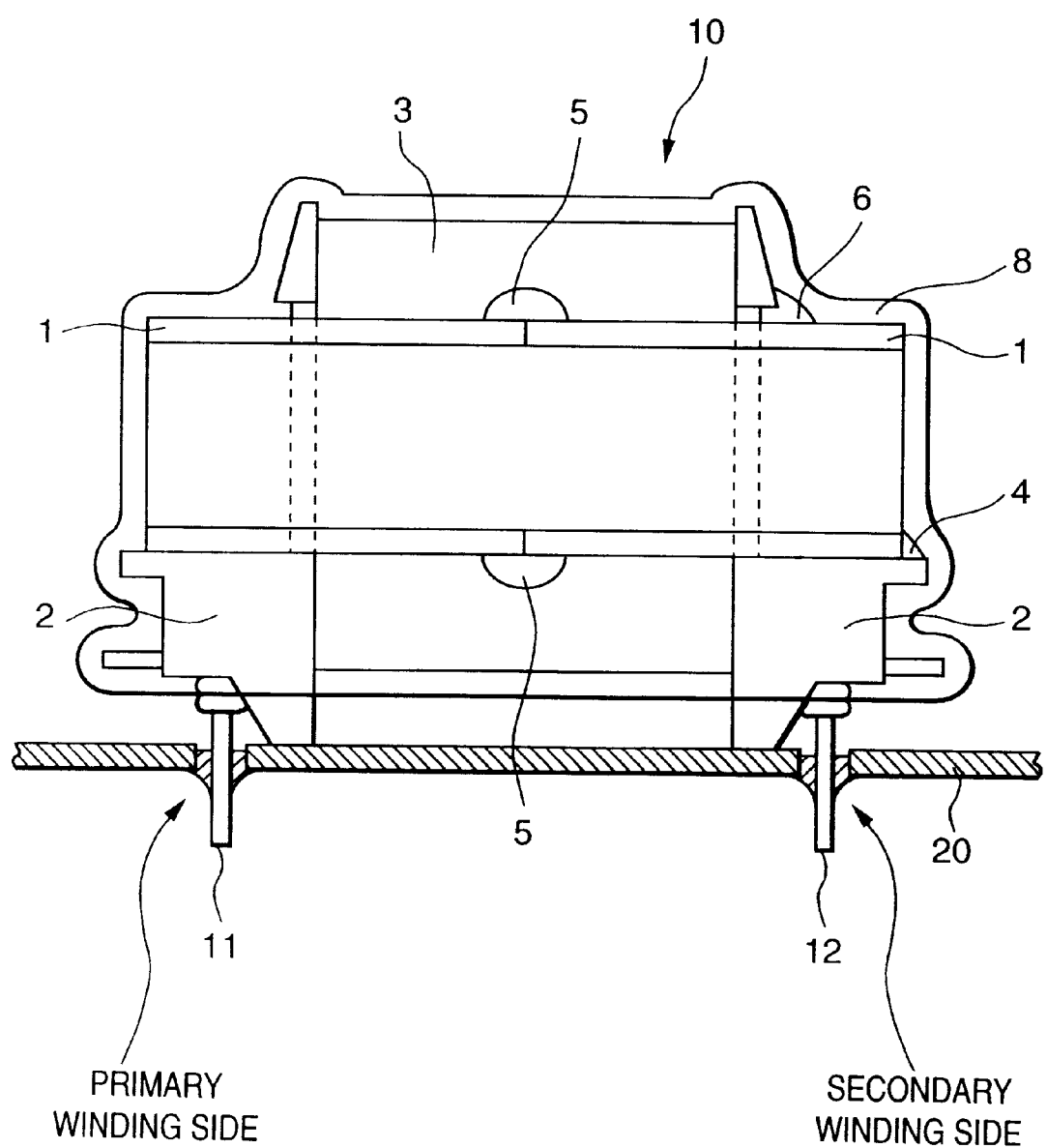
FIG. 15 is a front view of the structure of a transformer in accordance with the ninth embodiment.

FIG. 15 is a front view showing the structure of a transformer in accordance with the ninth embodiment. This embodiment is characterized in that after the adhesive 4 used to secure the bobbin and core is applied in the same manner as that described in either of the aforesaid embodiments, the transformer is impregnated with a varnish 8, and the varnish 8 is then dried. Since the varnish 8 is dried at the temperature of about 120-C, the thermosetting adhesive remains hardened. This is advantageous.

Owing to the above structure, although a phenomenon that a transformer makes a sound at a natural frequency is likely to occur when the core is fixed to the bobbin using the adhesives 4, 5, and 6 alone, the phenomenon will not take place. Moreover, since the varnish permeates through gaps between the core and bobbin, the core is attached to the bobbin on a planar basis. This provides the merit that the strength against a drop further improves.

As mentioned above, a transformer produced by assembling a winding member, which is made by winding a wound material about a bobbin, and a ferromagnetic core includes an affixing means for securing the bobbin and core which is applied relative to a primary winding and secondary winding. The affixing means is a thermosetting adhesive. Without the use of any special means or material, the transformer can be produced in the on-going process of manufacturing a transformer. Moreover, the strength of the transformer against a drop can be retained.

Moreover, the affixing means used to secure the bobbin and core and applied relative to the primary winding and secondary winding is applied to a plurality of positions on the surfaces of the windings opposed to the core and joined with the bobbin which include at least the four corners of the bobbin of the transformer or which lie on lines on the outer circumference of the transformer, along which the core and bobbin are joined with each other, and include at least the four corners of the bobbin of the transformer. The transformer need not be placed upside down in the process of manufacturing a transformer. In addition to the aforesaid advantages, there are the advantages that adhesives can be applied readily and the production line can be automated.

Moreover, the affixing means used to secure the bobbin and core and applied relative to the primary winding and secondary winding is applied to a plurality of positions lying on lines, along which the bobbin and core are joined with each other, at four inner corners of the transformer when the transformer is seen from the side thereof opposite to the substrate. A larger amount of adhesive can therefore be applied. Moreover, since an adhesive can be readily poured into gaps between the core and bobbin, the higher and more stable strength of adhesive bonding can be provided.

Moreover, the affixing means used to secure the bobbin and core is applied to positions different between the primary winding and secondary winding. The positions relative to one winding to which the affixing means is applied are positions on the surface of the winding opposed to the core and joined with the bobbin which include at least two corners of the bobbin of the transformer or which lie on a line on the outer circumference of the transformer along which the core and bobbin are joined with each other and include at least two corners of the bobbin of the transformer. The positions relative the other winding to which the affixing means is applied are positions lying along a line, along which the bobbin and core are joined with each other, at two corners out of the four inner corners of the transformer, which are defined by the other winding that is not secured, along the line when the transformer is seen from the side thereof opposite to the substrate. Even when a moment causing a breakdown and imposed on the bobbin due to an impact of a drop is deflected, reinforcement can be achieved effectively.

Moreover, when the core is fixed to the bobbin, the core is aligned with one side of the transformer so that the affixing means can be applied to larger areas at positions on the surface of one winding opposed to the core and joined with the bobbin which include at least two corners of the bobbin of the transformer. Besides, the strength of adhesive bonding can be improved.

After the affixing means used to secure the bobbin and core is applied, the transformer is impregnated with a varnish. Although a phenomenon that a transformer makes a sound at a natural frequency is likely to occur when the core is fixed to the bobbin using adhesives alone, the phenomenon will not take place. Moreover, since the varnish permeates through gaps between the core and bobbin, the core is affixed to the bobbin on a planar basis. The strength against a drop further improves.

As mentioned above, according to the present invention, there are provided a transformer assembling method, a transformer, and a transformer-mounted substrate in which the anti-breakdown strength of a transformer can be improved, the performance of a ferrite core can be drawn out fully, and the transformer can be designed to be compact and lightweight. Specifically, there is provided a transformer capable of resisting a drop and being produced according to the ongoing process of manufacturing a transformer without the use of any special component or material.

Figure 18:
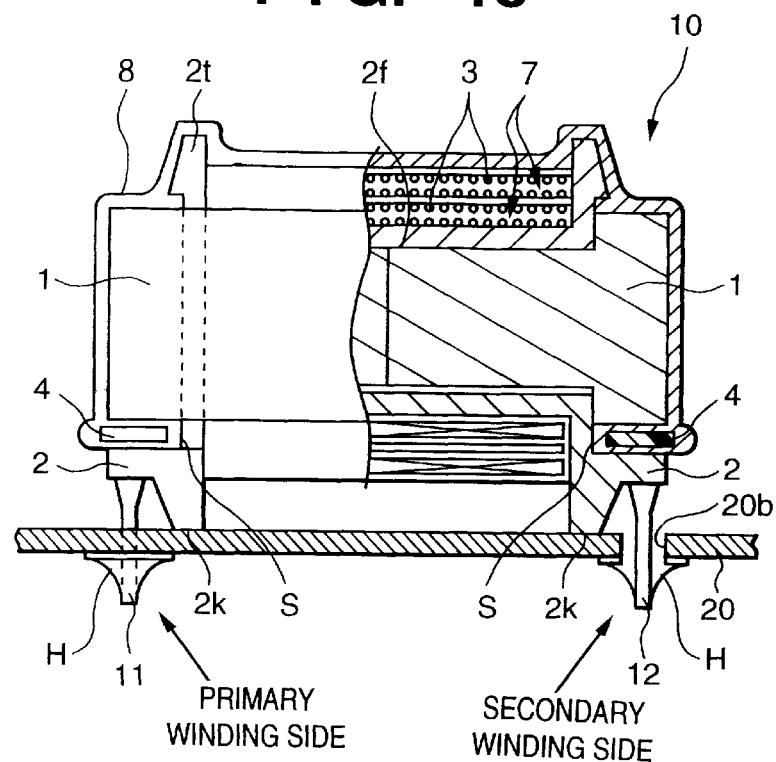
FIG. 18 is a front view showing a transformer 10 in accordance with the tenth embodiment mounted on a substrate with part of the transformer broken.
Figure 19:
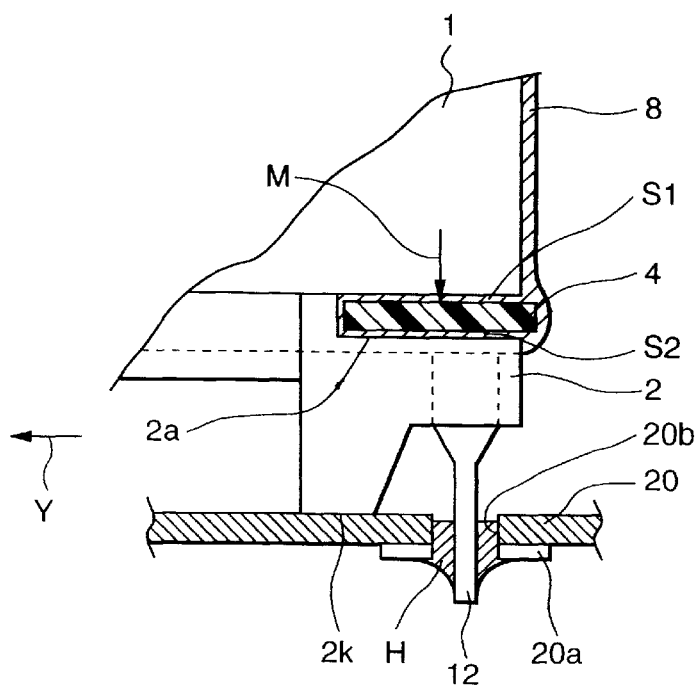
FIG. 19 is an enlarged view of a major portion of the transformer shown in FIG. 18.

FIG. 18 is a partly broken diagram showing a transformer in accordance with the tenth embodiment which is mounted on a substrate 20 and seen from the front side thereof. FIG. 19 is an enlarged sectional view of a major portion of the transformer shown in FIG. 18.

In the drawings, a bobbin is made of a given resin material by performing injection molding, and formed by uniting a winding member 2f, which has windings 3 of a primary winding and secondary winding and a bore 2t formed thereon and therein, with a primary winding fixture and secondary winding fixture adjoining the openings of the bore 2t. A ferromagnetic core 1 is divided into two portions and has a core portion thereof inserted into the bore 2t. The ferromagnetic core also has an enclosure for enclosing the windings 3. These components constitute a transformer 10.

Pedestals 2k of the bobbin 2 of the transformer 10 abut on a printed-circuit board 20 on which the transformer 10 is mounted. Lead pins 11 and 12 serving as terminals of the transformer 10 are inserted into holes 20b and secured with solder H.

Moreover, an insulating tape 7 is wound about the windings 3 of the winding member 2f of the bobbin 2. The whole transformer is then coated with a varnish 8 with which the whole transformer is impregnated.

Gaps are created between the primary winding fixture and secondary winding fixture, which are coupled with the openings of the bore 2t, and the top of the ferromagnetic core 1 and between the primary and secondary winding fixtures and the bottom of the ferromagnetic core 1. A silicon rubber 4 of a given thickness is inserted into the gaps and secured by the varnish 8.

Figure 23:
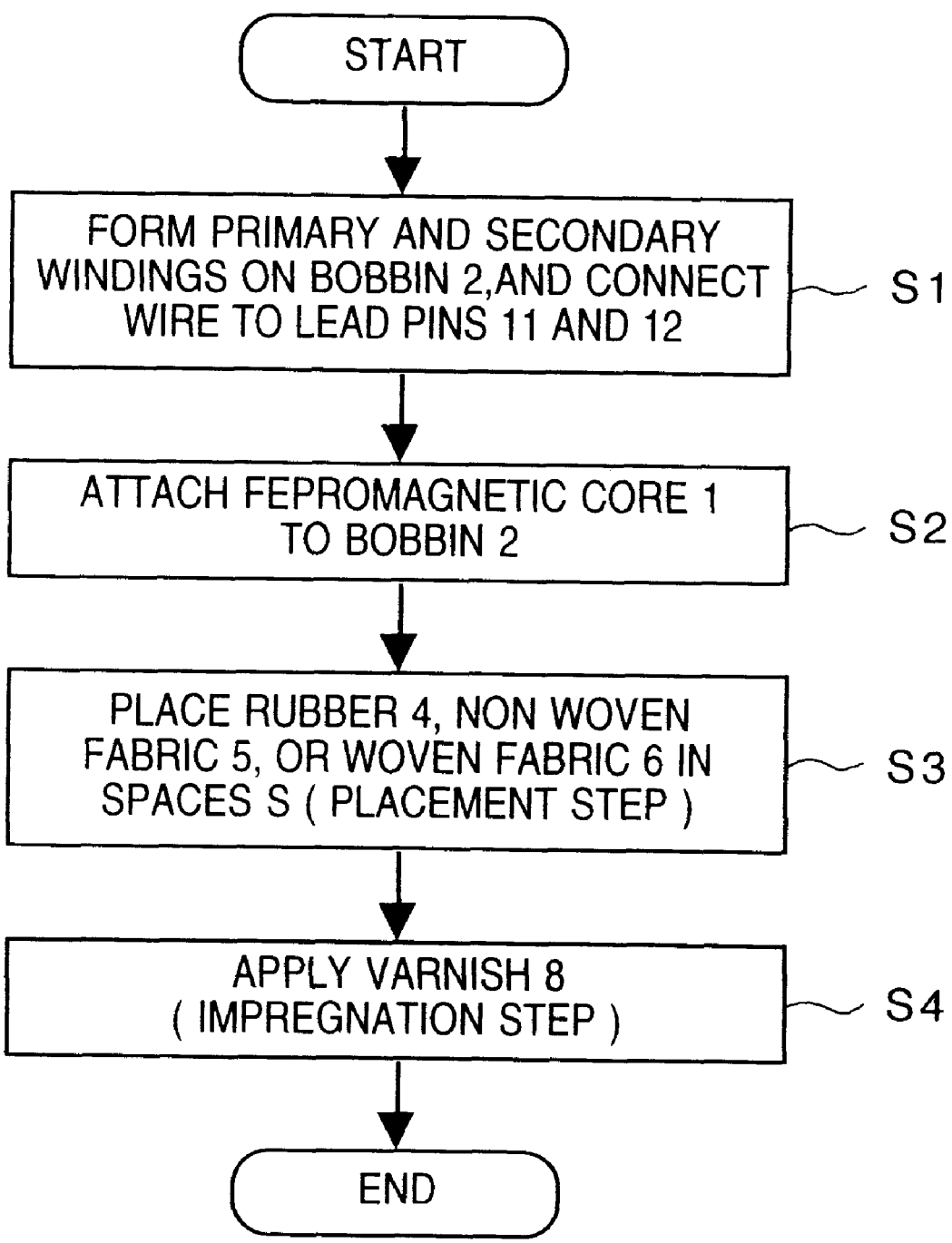
FIG. 23 is a flowchart describing a transformer assembling process.

For producing the transformer 10 having the foregoing structure, at step S1 in the flowchart describing the transformer assembling process of FIG. 23, lead wires are drawn out from the bobbin 2 of the transformer 10 having the primary and secondary windings, and, as shown in FIGS. 18 and 19, tangled about the lead pins 11 and 12 in order to thus connect the transformer to the printed-circuit board.

Thereafter, the ferromagnetic core 1 is attached at step S2. At step S2 of a placement step, the silicon rubber 4 is placed in the gaps S between the bobbin 2 and ferromagnetic core 1 of the transformer 10. At step S4 of an impregnation step, the whole transformer 10 is impregnated with the varnish 8 and thus hardened.

As mentioned above, since the silicon rubber 4 having a thickness corresponding to the height of the gaps S between the bobbin 2 and ferromagnetic material 1 is placed, the movement of the ferromagnetic core 1 relative to the bobbin 2 caused by a drop can be restrained. Eventually, the bobbin 2 can be prevented from cracking due to the movement of the ferromagnetic core 1 of the transformer caused by the drop.

Figure 20:
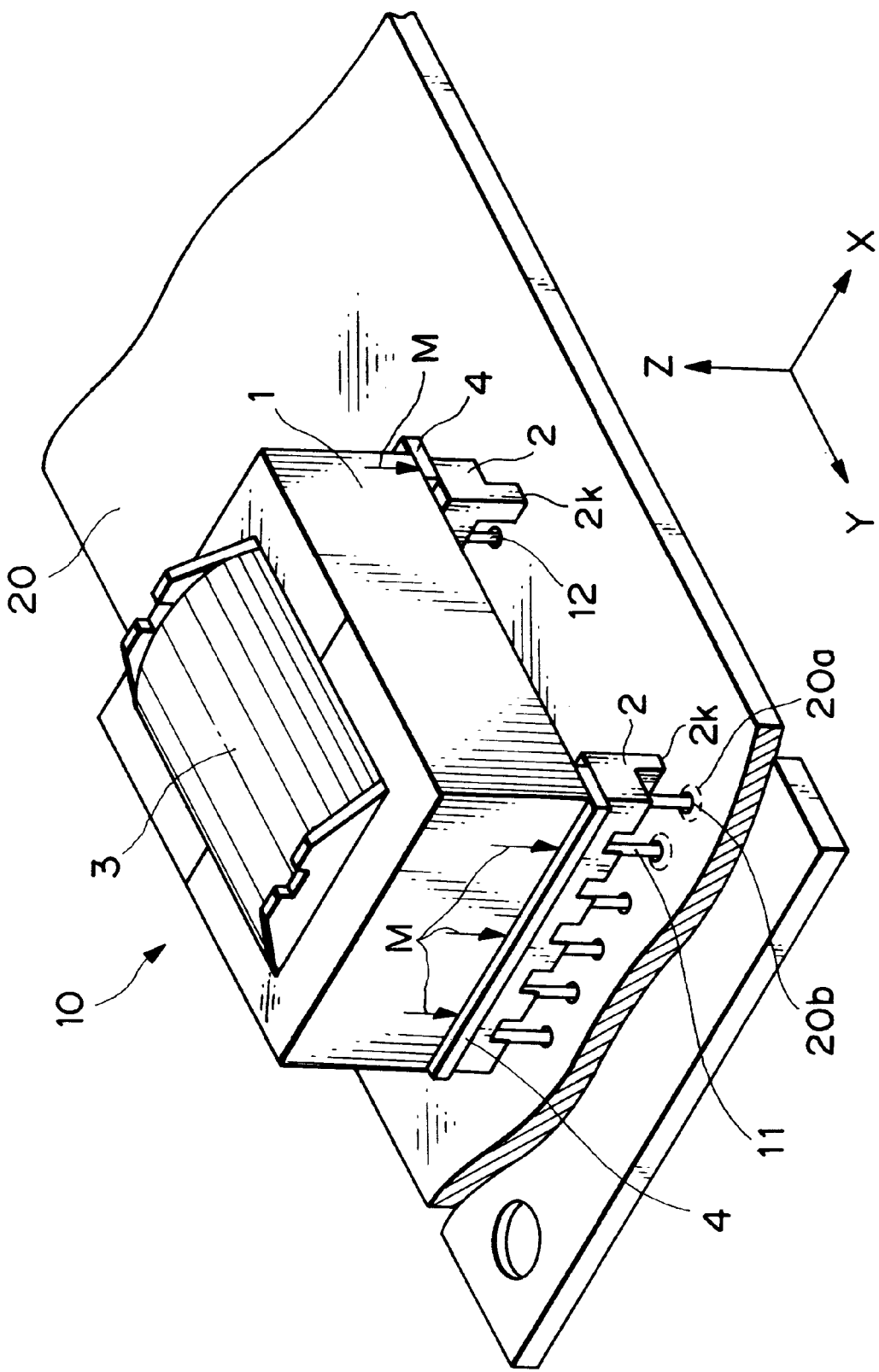
FIG. 20 is an oblique view of a transformer mounted on a substrate.

In the foregoing structure, as shown in the oblique view of FIG. 20, the transformer 10 mounted on the substrate 20 is resistive to a drop in any of X, Y, and Z directions, but especially to a drop in the Y direction.

Owing to the foregoing structure, a movement in the Y direction of the ferromagnetic core 1 deriving from a drop in the Y direction of the transformer 10 can be restrained. A load with a moment M imposed on the pedestals 2k of the bobbin 2 due to the movement of the ferromagnetic core 1 can therefore be alleviated. A stress concentrated on the ridges on the borders between the pedestals 2k of the bobbin 2 and the side surfaces thereof due to an angular moment M exerted by the ferromagnetic core 1 with the impact of the drop can be dispersed. Eventually, the bobbin can be prevented from cracking.

Moreover, the silicon rubber 4 serves as an impact absorbent because of the soft material thereof. When the angular moment M works, a tensile force is imposed on one pedestal 2k and a compression force is imposed on the other pedestal 2k. These forces are alleviated by the silicon rubber. The windings 3 of the transformer will therefore not be damaged and can be prevented from being disconnected.

Figure 21:
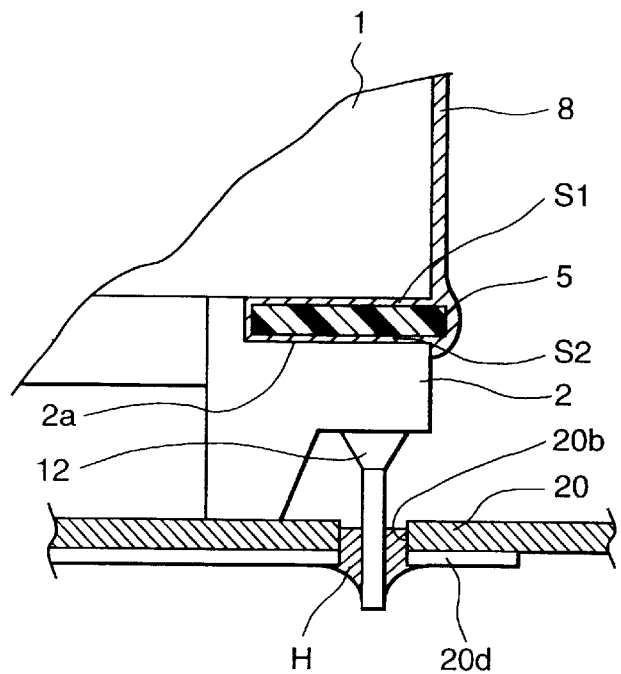
FIG. 21 is an enlarged sectional view of a major portion of a transformer in accordance with the tenth embodiment.

FIG. 21 is an enlarged view of a major portion shown in FIG. 18 in accordance with the second embodiment.

In the drawing, the same reference numerals will be assigned to the components that have already been described. The description of the components will be omitted. Different components alone will be described. In FIG. 21, gaps S2 are created between the top 2a of the bobbin 2 of the transformer 10 and the bottom of the ferromagnetic core 1. A nonwoven fabric 5 is placed in the gaps and used as an impregnation material through which the varnish 8 permeates.

In the assembling process for the transformer 10, the nonwoven fabric 5 is placed in the gaps between the bobbin 2 of the transformer 10 having the windings and the ferromagnetic core 1. Thereafter, the whole transformer 10 is impregnated with the varnish 8. The varnish 8 permeates through the nonwoven cloths 5 existent on the tops 2a of the pedestals 2k of the bobbin 2 of the transformer 10 and on the bottom of the ferromagnetic core 1.

The permeative varnish 8 is also poured into the gaps S1 under the bottom of the ferromagnetic core 1. After varnishing is completed, the transformer 10 is heated in order to harden the varnish 8.

As mentioned above, since the varnish 8 permeates through all over the nonwoven fabrics 5 existent in the gaps between the bobbin 2 and ferromagnetic core 1 of the transformer 10 and then hardens, an affixing layer is formed in each of the gaps between the ferromagnetic core 1 and bobbin 2 owing to the adhesion of the varnish 8 with no air left on the interface. The fixation between the bobbin 2 and ferromagnetic core 10 of the transformer 10 thereof can be reinforced.

The nonwoven fabrics 5 in the gaps under the ferromagnetic core 1 and impregnated with the varnish 8 can restrain the ferromagnetic core 1 from moving relative to the bobbin 2 with an impact of a drop while deforming in the direction of the thickness thereof. Moreover, the nonwoven fabric 5 impregnated with the varnish 8 serves as a proper impact absorbent to alleviate an impact of a drop. Consequently, the bobbin can be prevented from being cracking.

In the foregoing structure, the transformer 10 mounted on the substrate 20 is resistive to any drop irrespective of the direction of the drop and especially to a drop in the Y direction shown in FIG. 20. Owing to the structure, since the movement in the Y direction of the ferromagnetic core 1 deriving from an impact of a drop in the Y direction of the transformer 10 can be restrained, the impact imposed on the pedestals and side surfaces of the bobbin 2 due to the movement of the ferromagnetic core 1 can be alleviated.

A drop test was conducted under the conditions that the transformer 10 was soldered to the substrate 20 and then stowed in a housing and the housing was dropped with each of six surfaces thereof facing downward. At that time, when the housing was dropped repeatedly from the height of a work desk (approximately 75 cm) three times, the bobbin cracked. According to the structure of this embodiment, since the nonwoven fabric 5 whose thickness is slightly smaller than the height of the gaps S between the bobbin 2 and ferromagnetic core 1 is employed, even after the drop was repeated seven times, the bobbin did not crack.

As apparent from the results of the drop test, the structure of this embodiment can improve the anti-drop strength of the transformer 10.

Moreover, even when a drop test was conducted under a stricter condition that the height at which the drop was made was 1 mm, the bobbin did not crack.

Effects exerted by impregnating the nonwoven fabric 5 with the varnish 8 other than the effect of resisting an impact of a drop will be described below.

(1) The nonwoven fabric 5 to be placed in the gaps S between the bobbin 2 of the transformer 10 and the ferromagnetic core 1 thereof is inexpensive compared with the silicon rubber.

(2) The proper adhesion of the varnish 8 makes it possible to fix the ferromagnetic core 1 to the bobbin 2 to such an extent that the ferromagnetic core will not crack despite thermal expansion.

(3) At the step of impregnating the whole transformer 10 with the varnish, the nonwoven fabric 5 is impregnated with the varnish. The fixation between the bobbin 2 and ferromagnetic core 1 of the transformer 10 can be reinforced. No special means such as an adhesive is therefore necessary.

Figure 22:
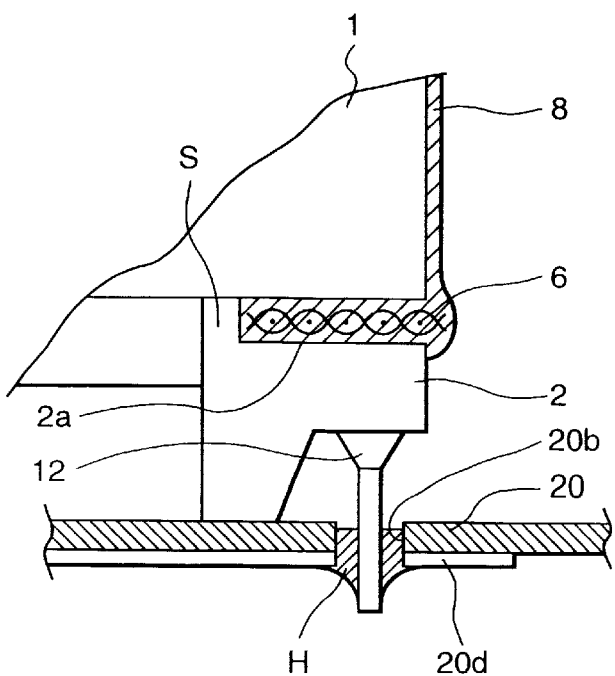
FIG. 22 is an enlarged sectional view of a major portion of a transformer in accordance with the eleventh embodiment.

FIG. 22 is an enlarged view showing part of a side surface of a transformer in accordance with the eleventh embodiment.

In the drawing, the same reference numerals are assigned to the components that have already been described. The description of the components will be omitted, and different components alone will be described. A woven fabric 6 that is an isolating member is placed in the gaps S between the bobbin 2 and ferromagnetic core 1. The permeation of the varnish 8, which is an impregnation material, through the isolating member can be controlled by changing the size of each mesh of the fabric.

As a result, a woven fabric that is optimal in terms of the permeation of an impregnation material can be selected. This brings about the merit of a more stable adhesive force.

The structures of the transformer 10 resistive to a drop in accordance with the embodiments are concerned with a transformer whose ferromagnetic core 1 is placed sideways. The structures can be adapted to a transformer whose ferromagnetic core 1 is placed lengthwise.

As mentioned above, the isolating member whose thickness nearly corresponds to the height of the spaces created between the bobbin and ferromagnetic core is placed in the spaces. The movement of the ferromagnetic core relative to the bobbin deriving from a drop can therefore be restrained. Eventually, the bobbin can be prevented from cracking due to the movement of the ferromagnetic core of the transformer deriving from the impact of the drop.

In other words, since the proper impact absorbent is included. An impact of a drop can be alleviated for fear the windings of the transformer be damaged. Thus, the windings of the transformer can be prevented from being disconnected. Moreover, the anti-drop strength of the transformer can be improved without a drastic change in the known transformer assembling process merely by adding an easy step and modifying the impregnation step that is the last step of the known transformer assembling. No special means such as an adhesive is therefore necessary. This is advantageous.

According to the present invention, as mentioned above, there are provided a transformer assembling method, a transformer, and a transformer-mounted substrate in which the anti-breakdown strength of a transformer can be improved, the performance of a ferrite core can be drawn out fully, and the transformer can be designed to be compact and lightweight.

Figure 24:
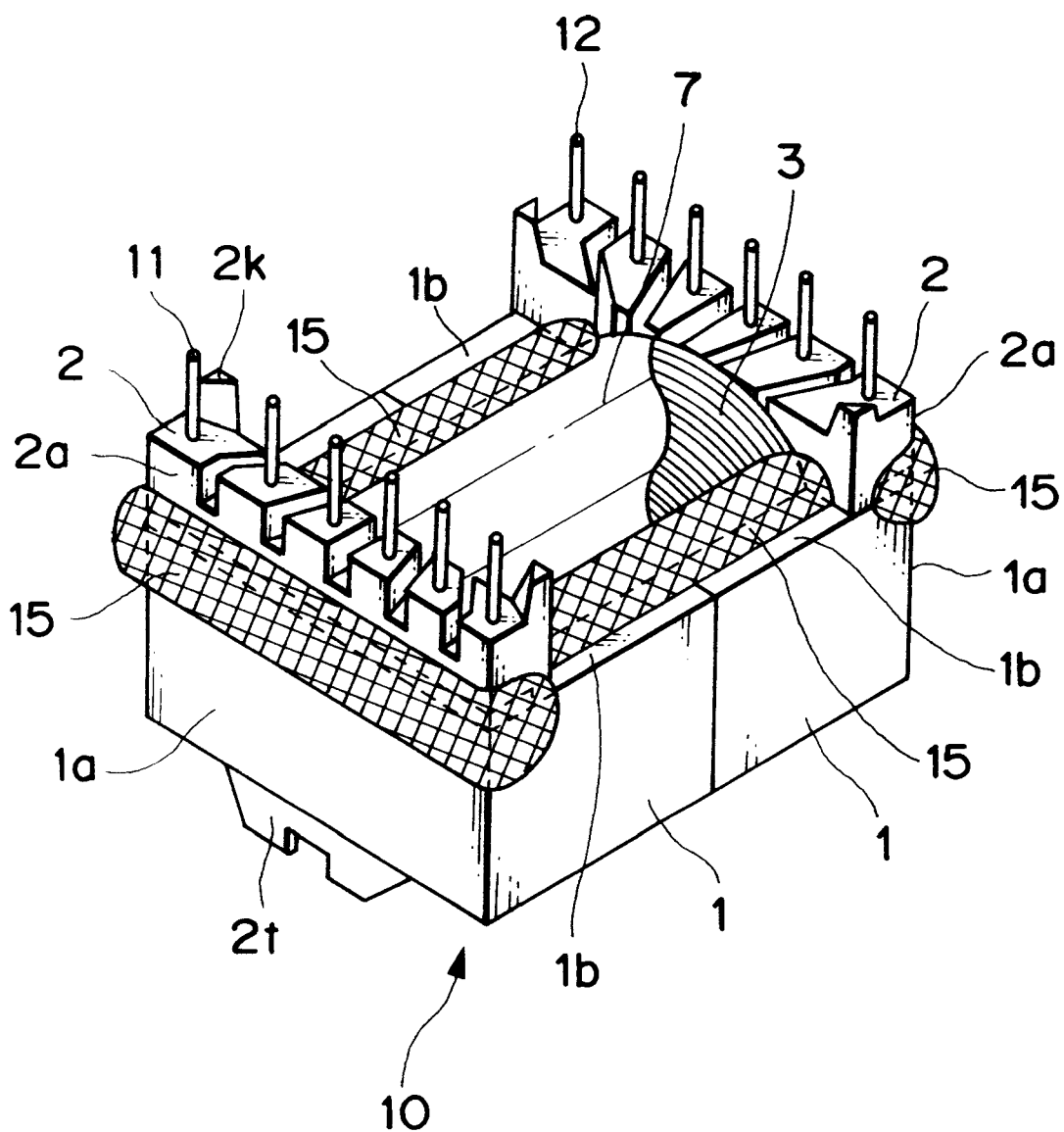
FIG. 24 is an oblique view showing a transformer 10 in accordance with the twelfth embodiment which is seen from the components-mounted surface of a substrate.
Figure 25:
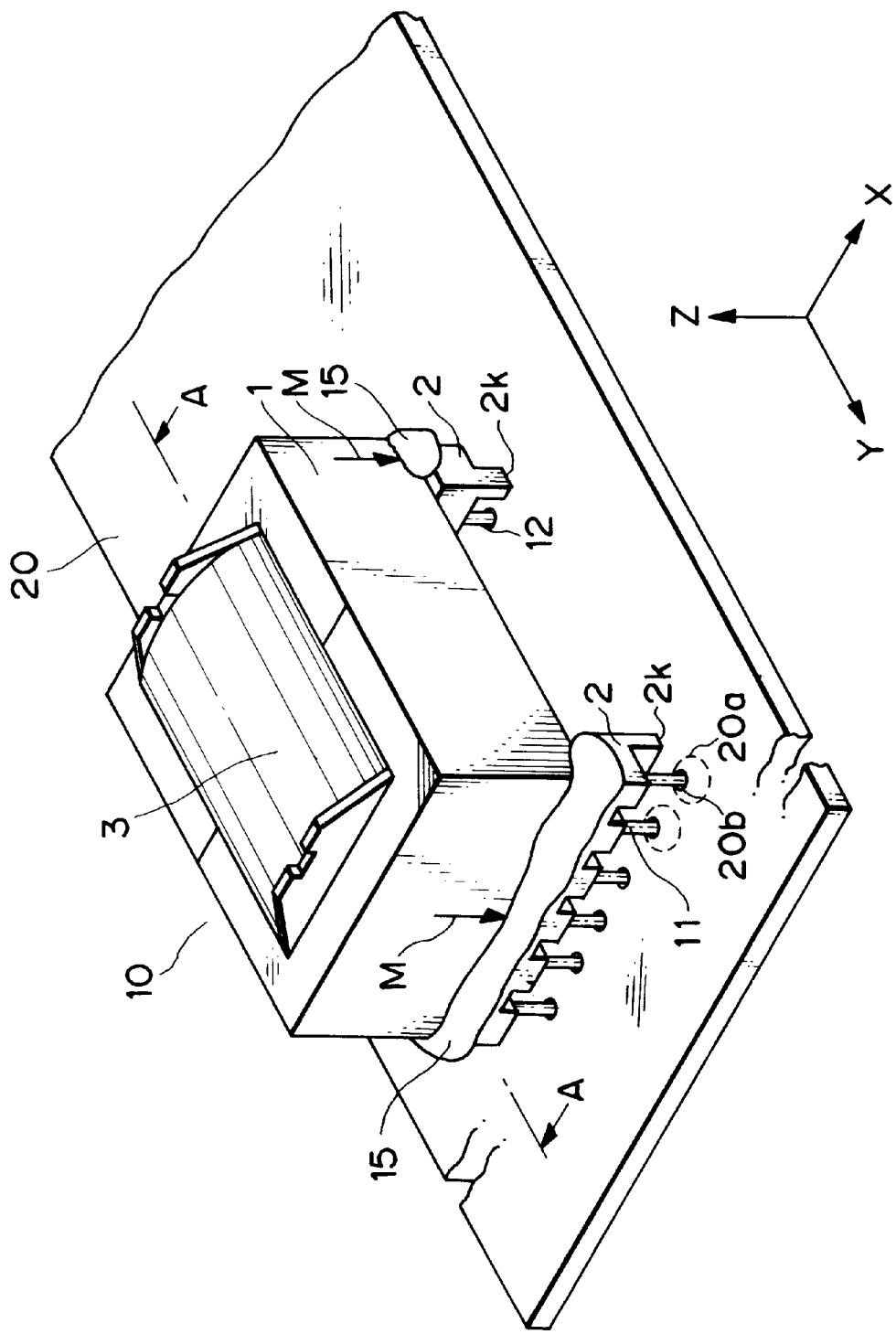
FIG. 25 is an oblique view showing a transformer 10 mounted on a substrate 20.
Figure 26:
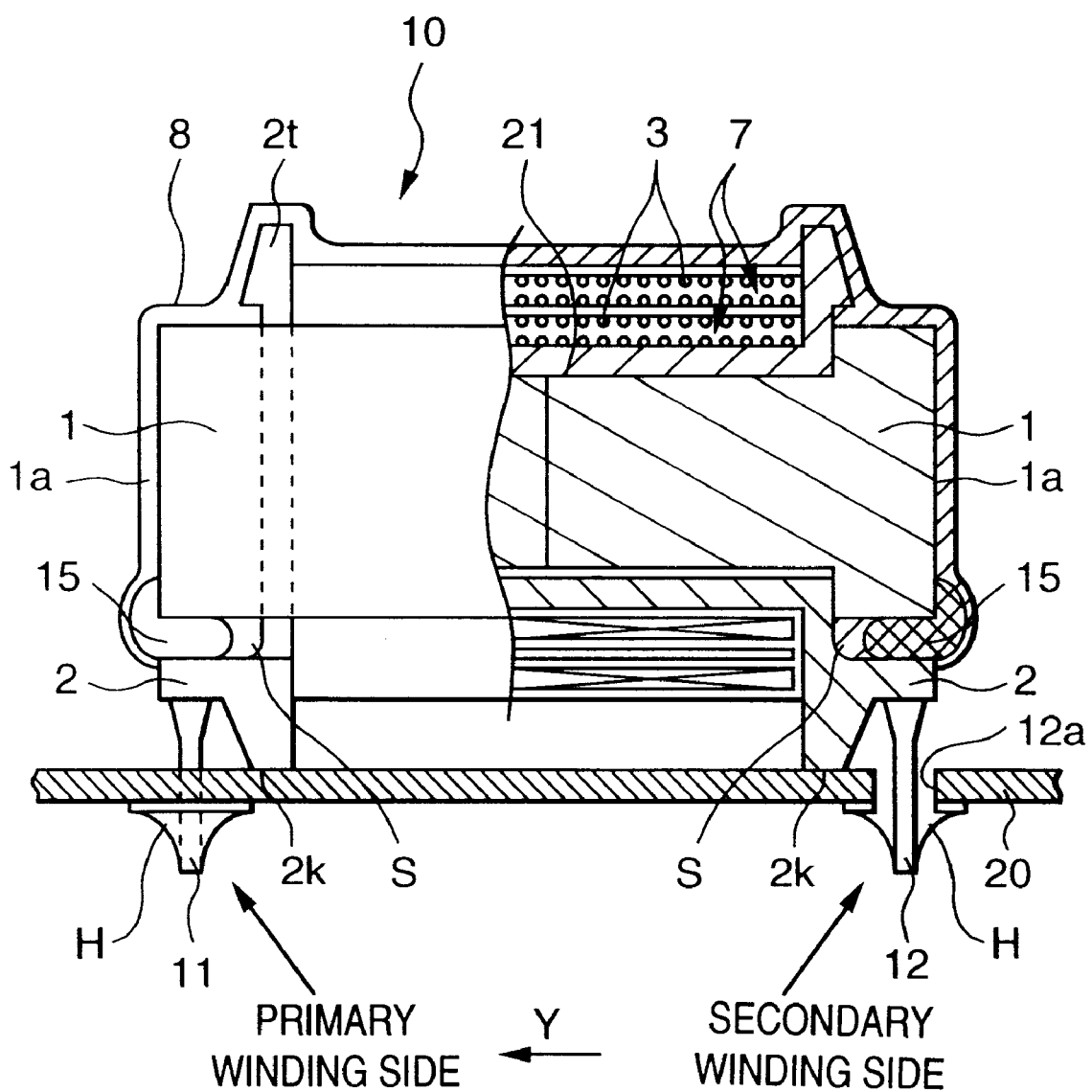
FIG. 26 is an A—A sectional view of the transformer shown in FIG. 25.

Next, FIG. 24 is an oblique view showing a transformer 10 in accordance with the twelfth embodiment which is seen from the side of the transformer opposed to a substrate. FIG. 25 is an oblique view showing the transformer 10 mounted on the substrate 20. FIG. 26 is an A—A sectional view of the transformer shown in FIG. 25.

In FIG. 26, a bobbin is made of a given resin material by performing injection molding, and formed by uniting a winding member 2f, which has primary and secondary windings 3 and a bore 2t formed thereon and therein, with a primary winding fixture and secondary winding fixture adjoining the openings of the bore 2t. A ferromagnetic core 1 is divided into two portions, and has the core portion thereof inserted into the bore 2t. The ferromagnetic core also includes an enclosure for enclosing the windings 3. These components constitute a transformer 10.

Pedestals 2k of the bobbin 2 of the transformer 10 abut directly on the surface of a printed-circuit board 20 on which the transformer 10 is mounted. Lead pins 11 and 12 serving as terminals of the transformer 10 are inserted into holes 20b of the substrate 20 and then secured using solder H.

Moreover, an insulating tape 7 is, as illustrated, wound about the windings 3 of the winding member of the bobbin 2. The whole transformer is impregnated with and coated with a varnish 8.

Gaps are created between the primary winding fixture and secondary winding fixture coupled with the openings of the bore 2t and the top of the ferromagnetic core 1 and between the primary winding fixture and secondary winding fixture and the bottom of the ferromagnetic core 1. A hot-melt adhesive 15 (for example, adhesive Jet-melt Nos. 3764, 3748, or 3797 manufactured by Sumitomo 3M Co., Ltd.) is applied to areas along lines, along which the bobbin 2 and core 1 are joined with each other, on the side of the transformer opposed to the substrate 20 and to areas on the margins of the isolating tape 7 wound about the outer circumferences of the windings 3.

In FIG. 24, the hot-melt adhesive 15 is also applied to valleys between the outer circumference of the isolating tape 7 covering the windings 3 of the transformer 10 and surfaces 1b of the ferromagnetic core 1.

The hot-melt adhesive 15 is thus used for affixing. The fixation between the bobbin 2 and ferromagnetic core 1 can be reinforced. As a result, the bobbin of the transformer 10 can be prevented from cracking due to an impact of a drop irrespective of the direction of the drop. In particular, since the hot-melt adhesive 15 is soft, it is effective in absorbing the impact of the drop. With the hot-melt adhesive, a proper impact absorbent can therefore formed. This is a very effective countermeasure against cracking of the bobbin.

The hot-melt adhesive 15 is hardened at a room temperature immediately after it is jetted out of a heat gun. Unlike an epoxy adhesive made of a thermosetting resin, it does not take much time for the hot-melt adhesive to harden. This leads to good workability and each handling. The hot-melt adhesive is therefore optimal for mass-production.

The hot-melt adhesive 15 has already been used at a step of firmly affixing a housing, or any other step in the process of producing a known electronic device. There is no problem in terms of safety.

In FIG. 26, the varnish 8 is impregnated through the whole transformer 10 and hardened at the impregnation step. The varnish 8 is intended to prevent the transformer from making a sound. If sufficient strength of adhesive bonding is ensured, the varnish need not be employed.

In FIG. 24, when the gaps S between the bobbin 2 and ferromagnetic core 1 are almost negligible, if the hot-melt adhesive 15, shown by cross hatching line hereafter, is applied to the areas linking the outer surfaces 2a of the primary winding fixture and secondary winding fixture and the outer surfaces 1a of the ferromagnetic core 1, the movement of the ferromagnetic core 1 relative to the bobbin 2 deriving from a drop can be restrained. Consequently, the bobbin 2 can be prevented from cracking due to the movement of the ferromagnetic core 1 of the transformer deriving from the drop.

In the foregoing structure, the transformer 10 mounted on the substrate 20 is, as shown in the oblique view of FIG. 25, resistive to a drop in any of X, Y, and X directions and especially to a drop in the Y direction. Since the movement in the Y direction of the ferromagnetic core 1 deriving from an impact of a drop in the Y direction of the transformer 10 can be restrained by applying the adhesive 15, a load with a moment M imposed on the pedestals 2k of the bobbin 2 due to the movement in the Y direction of the ferromagnetic core 1 can be alleviated. A stress concentrated on the ridges on the borders between the pedestals 2k of the bobbin 2 and the side surfaces thereof due to an angular moment M exerted by the ferromagnetic core 1 with the impact of the drop can be dispersed, whereby the bobbin can be prevented from cracking.

Moreover, the hot-melt adhesive 15 serves as a proper impact absorbent owing to the soft material thereof. When the substrate 20 is dropped, if the angular moment M works, a tensile force is imposed on one pedestal 2k and a compression force is imposed on the other pedestal 2k. These forces are alleviated by the hot-melt adhesive 15. The windings 3 of the transformer will therefore not be damaged too terribly and can therefore be prevented from being disconnected.

Figure 27:
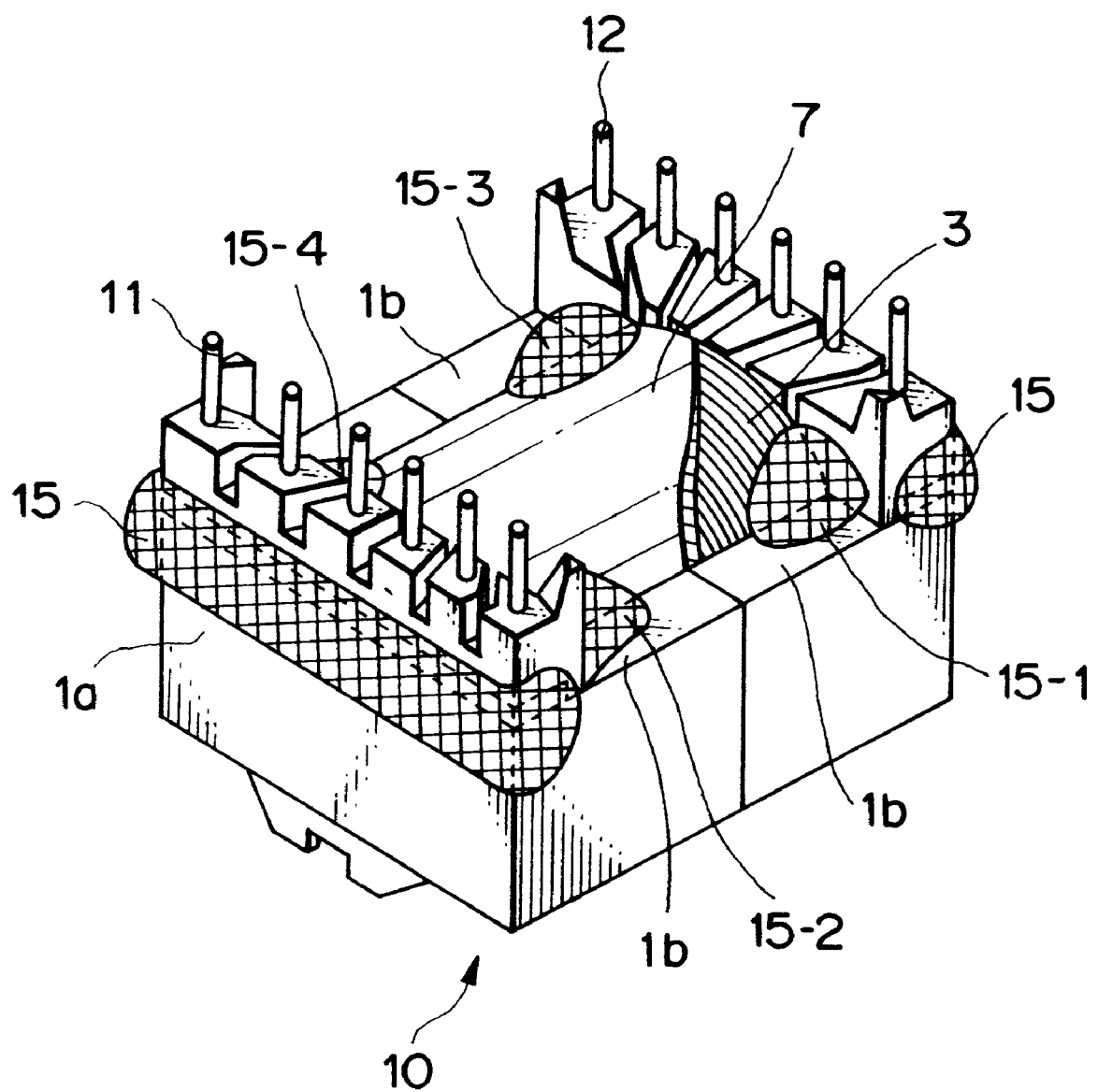
FIG. 27 is an oblique view showing a transformer 10 in accordance with the thirteenth embodiment which is seen from the components-mounted surface of a substrate 20.

FIG. 27 is an oblique view showing the appearance of a transformer 10 in accordance with the thirteenth embodiment. The same reference numerals are assigned to the components that have already been described. The description of the components will be omitted. The hot-meld adhesive 15 is, as illustrated, applied to areas linking the outer surfaces 2a of the primary winding fixture and secondary winding fixture and the outer surfaces 1a of the ferromagnetic core 1, and to four corners 15-1, 15-2, 15-3, and 15-4.

Owing the foregoing structure, with a smaller amount of adhesive 15, anti-impact strength equivalent to that provided according to the first embodiment can be provided. Moreover, another component can be mounted adjacently to a portion of the transformer to which no adhesive is applied. This leads to the improved freedom in designing a pattern for the substrate 20. Moreover, the amount of hot-melt adhesive employed is small. The structure is therefore suitable for mass-production.

Figure 28:
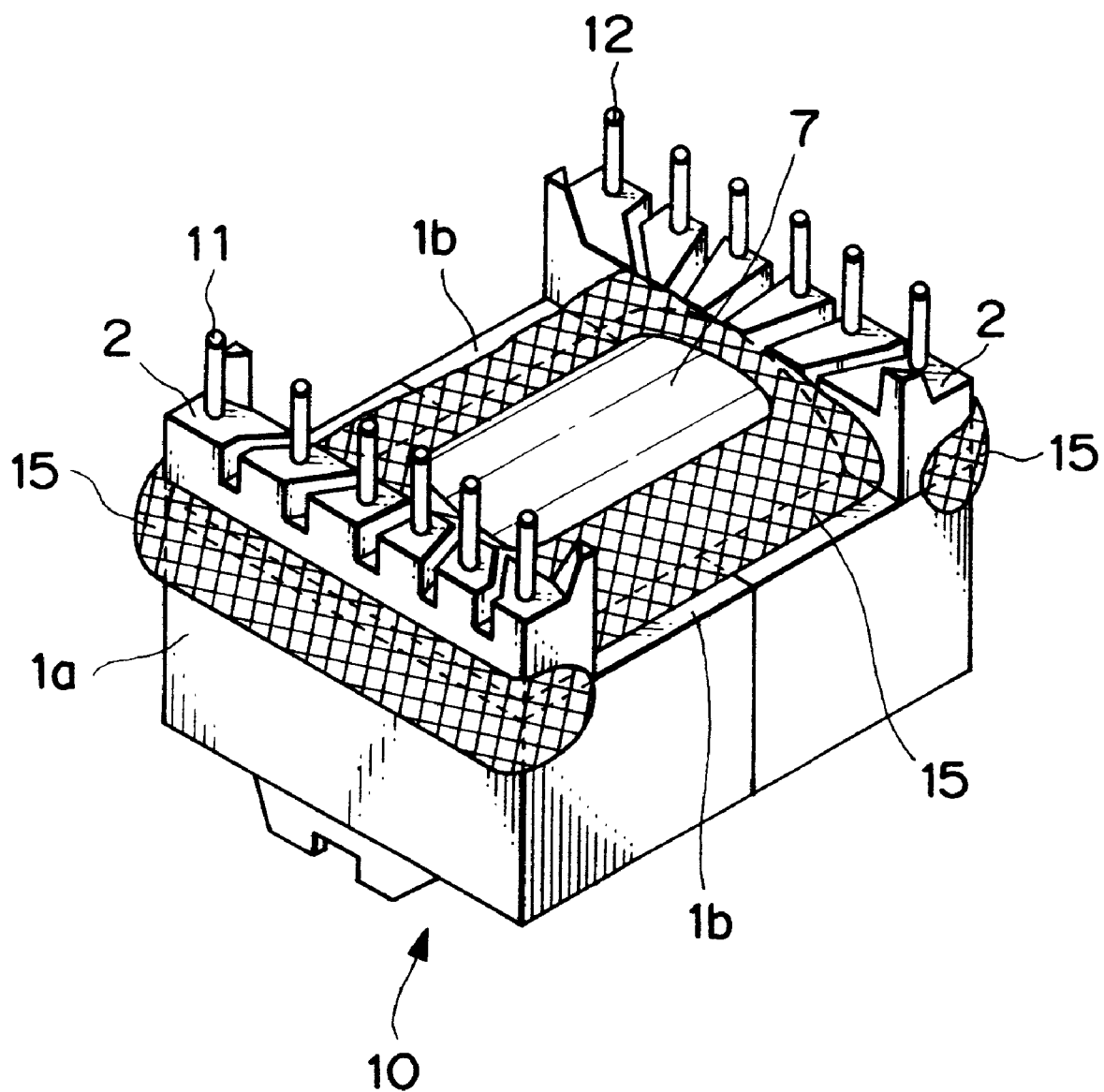
FIG. 28 is an oblique view showing a transformer 10 in accordance with the fourteenth embodiment which is seen from the components-mounted surface of a substrate 20.

FIG. 28 shows the appearance of a transformer 10 in accordance with the twenty-eighth embodiment.

In the drawing, the same reference numerals are assigned to the components that have already been described. The description of the components will be omitted. The hot-melt adhesive 15 is applied to all areas along lines along which the tape 7 covering the bobbin on the side of the transformer opposed to the components-mounted surface of a substrate, and the bobbin 2 are joined with each other when the transformer is mounted o the substrate 20. Owing to the structure, the anti-impact strength of the transformer preventing the pedestals 2k of the bobbin 2 from cracking can be further improved.

According to the embodiment, the countermeasure against a drop is concerned with a transformer whose ferromagnetic core is placed sideways. The countermeasure may be taken to protect a transformer whose ferromagnetic core is placed lengthwise.

Figure 29A:
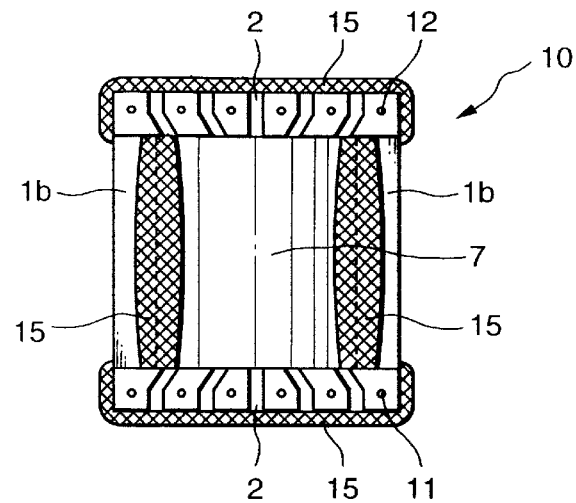
FIGS. 29A, 29B, and 29C are back views of a transformer.
Figure 29B:
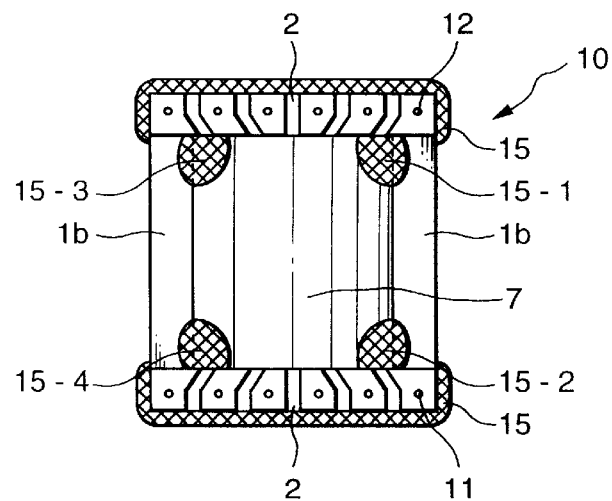
Figure 29C:
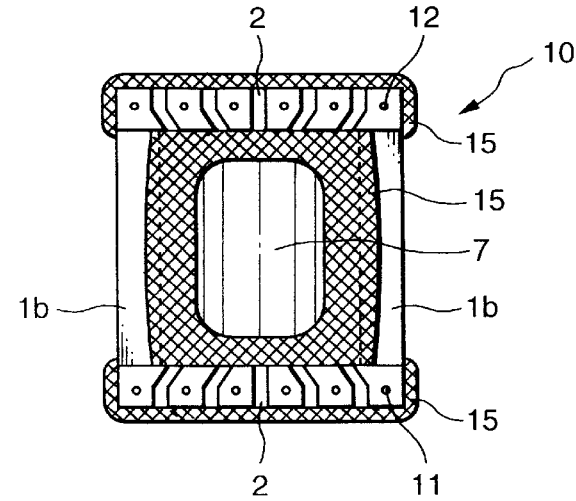

FIGS. 29A to 29C are bottom views showing the transformers in accordance with the aforesaid embodiments which are seen from the sides thereof opposed to the components-mounted surface of a substrate. In FIG. 29A, the hot-melt adhesive 15 is applied to valleys formed between the isolating tape 7 covering the outer circumferences of the windings and the surfaces 1b of the ferromagnetic core 1 and to areas linking the outer surfaces 2a of the primary winding fixture and secondary winding fixture and the outer surfaces 1a of the ferromagnetic core 1.

In FIG. 29B, the hot-melt adhesive 15 is applied to the four corners 15-1, 15-2, 15-3, and 15-4 formed among the isolating tape 7 covering the outer circumferences of the windings, the ferromagnetic core 1, and the surfaces of the primary winding fixture and secondary winding fixture which are opposed to each other, and to areas linking the outer surfaces 2a of the primary winding fixture and secondary winding fixture and the outer surfaces 1a of the ferromagnetic core 1.

In FIG. 29C, the hot-melt adhesive 15 is applied to valleys formed between the isolating tape 7 covering the outer circumferences of the windings and the ferromagnetic core 1, and to areas adjoining the valleys between the surfaces of the primary winding fixture and secondary winding fixture which are opposed to each other and the edges of the windings. Furthermore, the hot-melt adhesive 15 is applied to areas linking the outer surfaces of the primary winding fixture and secondary winding fixture and the outer surfaces of the ferromagnetic core.

Owing to the foregoing structure, the fixation between the core and bobbin can be reinforced. The bobbin can be prevented from cracking due to the movement of the core of the transformer derived from an impact of a drop. The anti-drop strength of the transformer can be improved. Moreover, since the hot-melt adhesive 15 is soft, it is effective in absorbing the impact of the drop. Moreover, since the hot-melt adhesive is hardened immediately after applied, the workability of applying the hot-melt adhesive is good and the hot-melt adhesive can be handled easily. Since the hot-melt adhesive has already been used in the process of manufacturing a known electronic device, there is no problem in terms of safety. Besides, the fixation in the areas in which the core 1 and bobbin 2 are joined with each other can be reinforced. The movement of the transformer deriving from a drop can be restrained. The bobbin can be prevented from cracking due to the impact of the drop. The anti-drop strength of the transformer can be improved. Moreover, since the fixation in the areas linking the side surfaces of the core and bobbin can be reinforced, when an impact of a drop is imposed on the transformer especially in a lateral direction, the movement of the transformer deriving from the drop can be restrained effectively. The bobbin can therefore be prevented from cracking due to the movement of the core. Eventually, the anti-drop strength of the transformer can be improved.

Furthermore, with a small amount of adhesive, the movement of the core of the transformer deriving from an impact of a drop can be restrained. Moreover, since the adhesive is applied to the four corners on the back of the core of the transformer, another component can be mounted adjacently to the transformer. This provides the freedom in designing a pattern for a substrate.

The fixation between the bobbin and core can be further reinforced owing to the adhesion of the varnish. When a thermoplastic adhesive is applied, the fixation between the core and bobbin can be further reinforced. The anti-drop strength of the transformer can be improved.

As mentioned above, the hot-melt adhesive is used to realize a proper impact absorbent. An impact of a drop is thus alleviated for fear the windings of the transformer be damaged too terribly. The windings of the transformer can thus be prevented from being disconnected. Moreover, the anti-drop strength of the transformer can be improved without a drastic change in the known transformer assembling process merely by adding a simple step of affixing.

Furthermore, the application of the hot-melt adhesive 15 may be carried out as a countermeasure taken to protect a transformer from a drop after the step of varnishing.

As mentioned above, according to the present invention, there are provided a transformer assembling method, a transformer, and a transformer-mounted substrate in which the anti-breakdown strength of a transformer can be improved, the performance of a ferrite core can be drawn out fully, and the transformer can be designed to be compact and lightweight.

Figure 30:
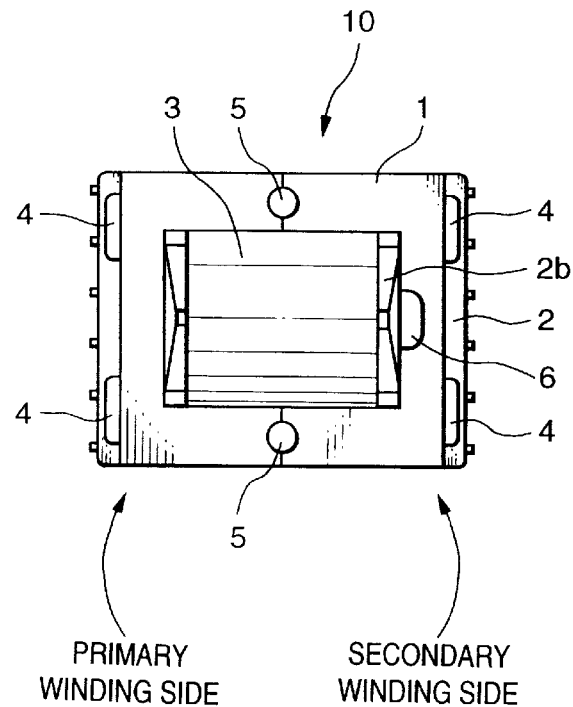
FIG. 30 is a plan view showing the structure of a transformer in accordance with the fifteenth embodiment.
Figure 31:
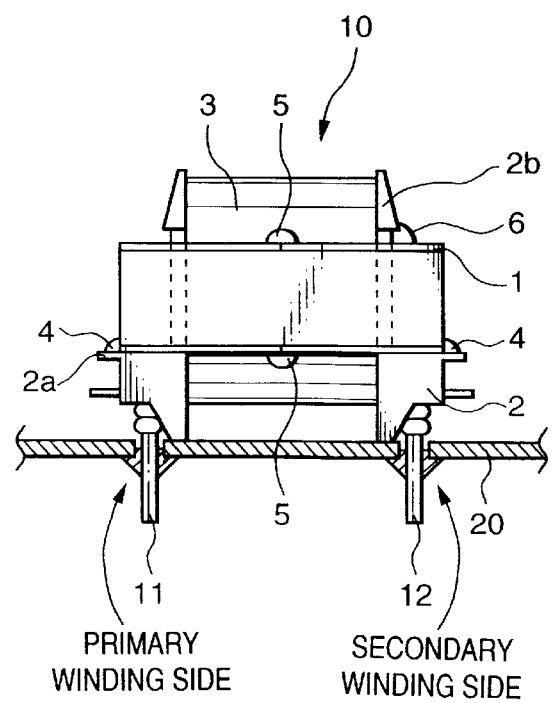
FIG. 31 is a front view of the structure shown in FIG. 30.

FIG. 30 is a plan view showing the structure of a transformer in accordance with the fifteenth embodiment, and FIG. 31 is a front view of the structure shown in FIG. 30.

Referring to FIGS. 30 and 31, a transformer employed in a switching power supply unit comprises a core 1 made of a ferrite, a bobbin 2 about which a wound material is wound to form windings and which is made of a resin, and a winding member 3 that is a coil made by winding a wound material used to form windings, an inter-layer isolation tape, and a barrier tape used to space the primary and secondary windings in order to meet safety standards according to a given winding method.

An adhesive 4 serving as an affixing means used to secure the bobbin 2 and core 1 is, as shown in FIGS. 30 and 31, applied to a total of four positions at the ends of the primary winding and secondary winding on the collars 2a of the bobbin 2. An epoxy adhesive that is a thermosetting adhesive is used as the adhesive 4. By contrast, an adhesive 5 is applied to the junctions between members constituting the core 1. An adhesive 6 is applied to the junction between the upper end 2b of the bobbin 2 at the end of the secondary winding and the core 1.

Various drop tests were conducted on the transformer 10 that was reinforced using the adhesives 4, 5, and 6 as mentioned above and mounted on a substrate. The transformer was compared with a transformer whose core 1 and bobbin 2 are not secured.

When the adhesive 4 is, as shown in FIGS. 30 and 31, applied to the four positions on the collars 2a at the ends of the primary winding and secondary winding, the bobbin 2 and core 1 are secured, and the strength of adhesive bonding between the bobbin 2 and core 1 is intensified. Eventually, a breaking force imposed on the bobbin, that is, a moment M or impact load deriving from a drop can be dispersed.

Figure 43:
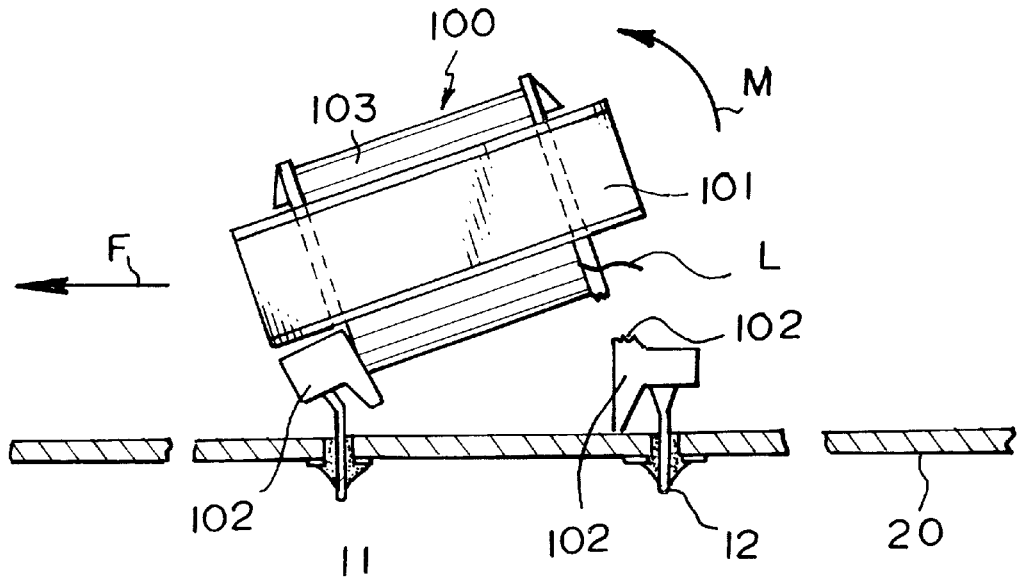
FIG. 43 is a front view showing a transformer broken down during known mounting of a transformer.
Figure 44A:
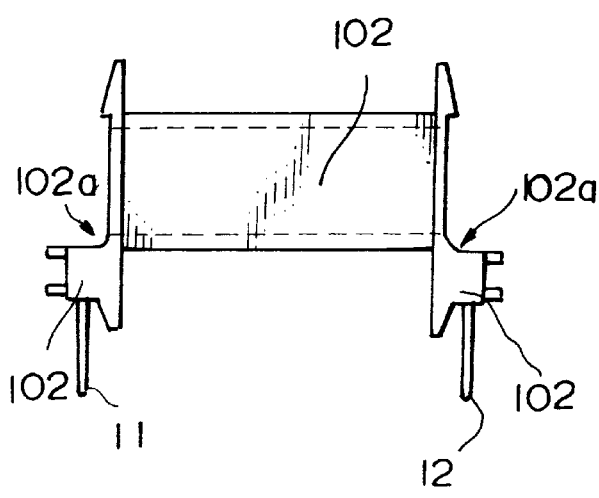
FIG. 44A is a front view of a bobbin of a known transformer.
Figure 44B:
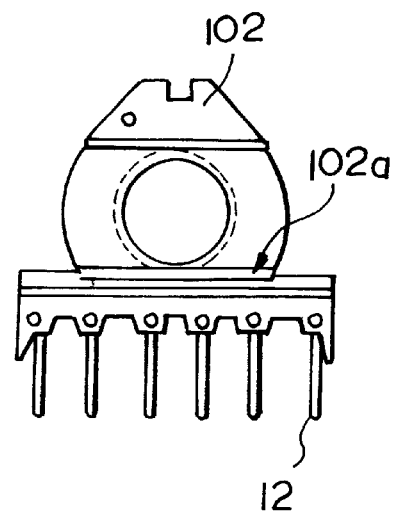
FIG. 44B is a right-hand side view of the bobbin of a known transformer.
Figure 45:
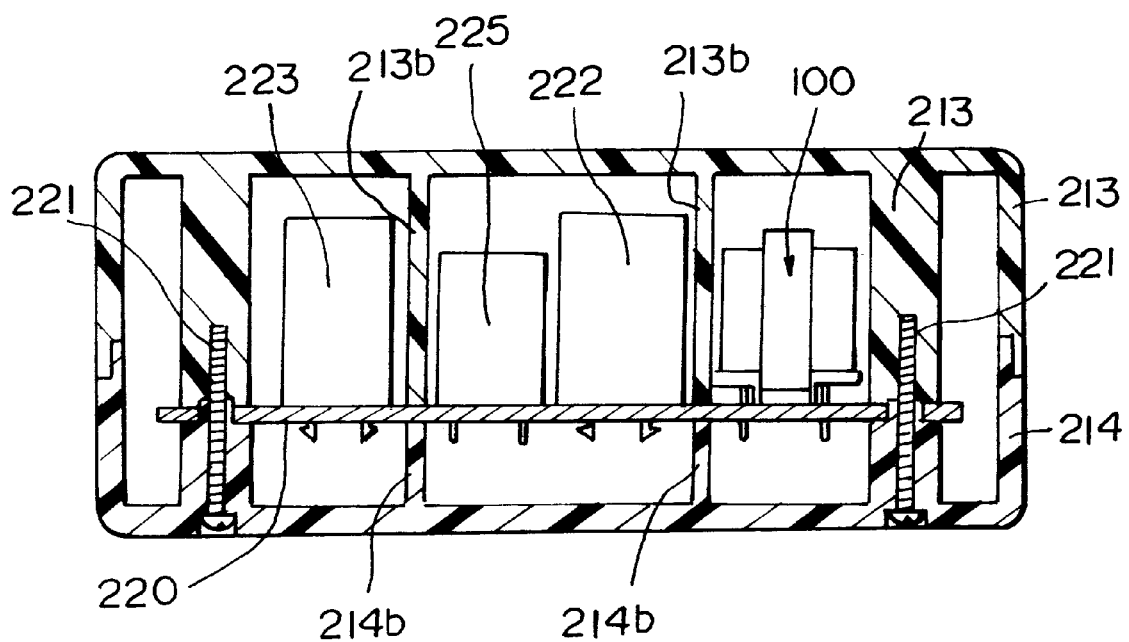
FIG. 45 is a sectional view of an example of a known structure for holding a substrate.
Figure 46:
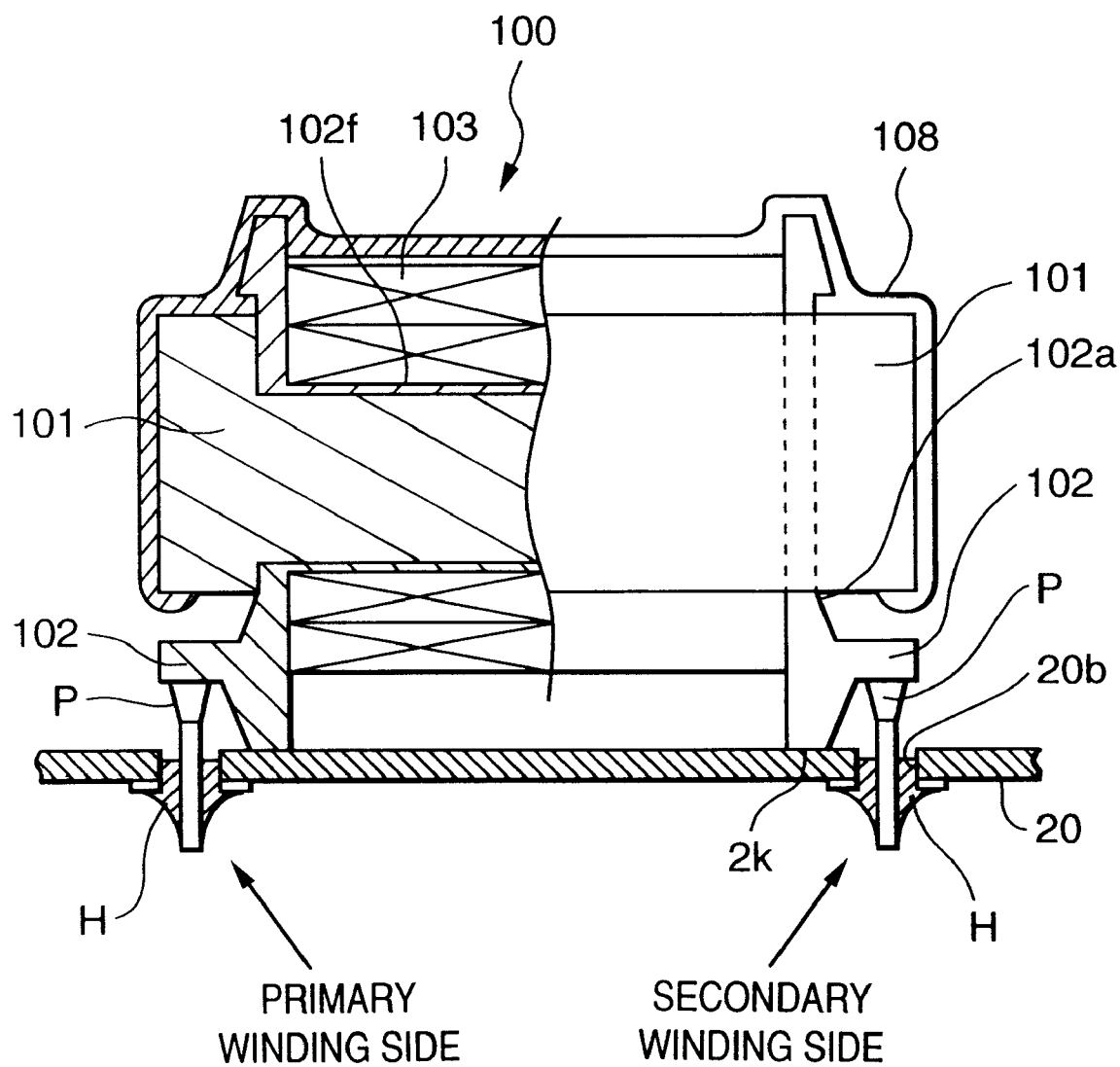
FIG. 46 is a front view of a known transformer that is mounted.

For example, as far as a known transformer is concerned, when the transformer is dropped off a desktop or an excessive impact is imposed on a power supply unit, a moment M or an excessive impact is concentrated on the transformer, which is heavier than the other components of the power supply unit, in a direction of an arrow shown in FIG. 43. The bobbin 2 fails to resist the moment or impact and is relatively readily ruptured near a portion thereof coupled to the winding member.

A drop test was conducted as one of various drop tests on a transformer whose core 1 and bobbin 2 were not secured.

Since the core 1 and bobbin 2 were not secured, the core 1 was thought to crack. As a result, the bobbin 2 cracked as shown in FIG. 43. It was confirmed that the core 1 had sufficient anti-impact resistivity but the strength of the bobbin 2 was insufficient.

In the above transformer, an epoxy adhesive was applied to the end of one winding. As a countermeasure, therefore, the adhesive 4 used to secure the bobbin 2 and core 1 is, as shown in FIGS. 30 and 31, applied to the four positions at the ends of the primary and secondary windings. The strength of adhesive bonding between the bobbin 2 and core 1 is thus intensified, whereby a breaking force imposed on the bobbin 2 with a moment M or an impact derived from a drop is dispersed.

As far as the known transformer is concerned, when it is dropped off a desktop (approximately 75 cm high) to a floor, it may be ruptured after one drop. Once the above countermeasure is taken, a transformer that will not be ruptured after seven drops in the same direction can be produced.

For producing the transformer, a simple change should merely be made at a step of applying an adhesive in the process of manufacturing a transformer, that is, the number of positions to which an adhesive is applied should merely be increased. This provides the merit that no special means or material is needed. Another merit is that the strength of a transformer against a drop improves.

Furthermore, an epoxy thermosetting adhesive is used as the affixing means used to secure the bobbin 2 and core 1. In addition to the foregoing advantage, there is the advantage that the strength of adhesive bonding will not be degraded by heat dissipated due to self-heating occurring when the transformer in a power supply unit is actuated.

Moreover, since an adhesive made of an epoxy material is employed, the strength of adhesive bonding between a bobbin and ferromagnetic core is intense. Besides, the strength of a hardened adhesive is equivalent to that of a material made into the bobbin.

Figure 32:
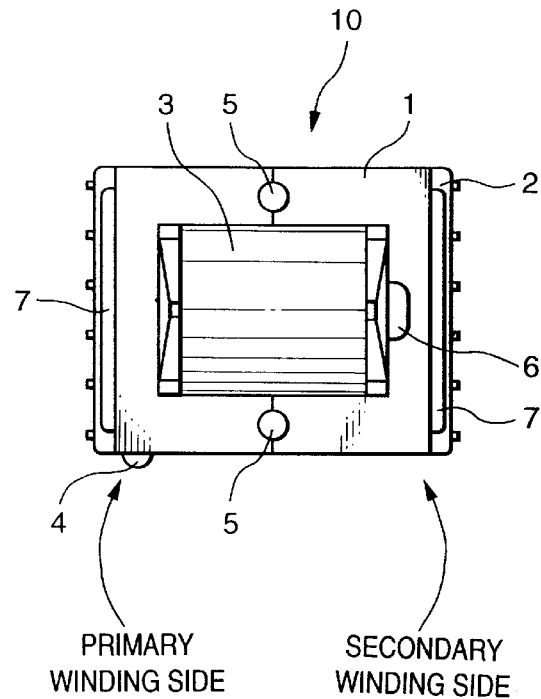
FIG. 32 is a plan view showing the structure of a transformer in accordance with the sixteenth embodiment.
Figure 33:
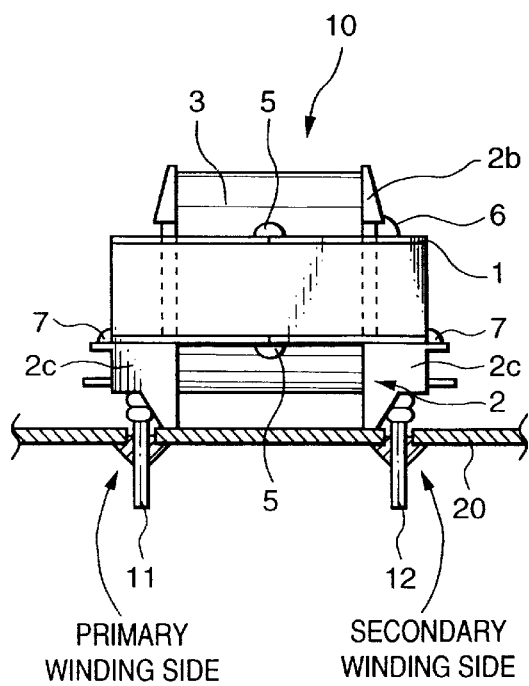
FIG. 33 is a front view of the structure shown in FIG. 32.

FIG. 32 is a top view showing the structure of a transformer in accordance with the sixteenth embodiment of the present invention, and FIG. 33 is a side view of the structure.

The sixteenth embodiment provides the same structure as the fifteenth embodiment. However, an affixing means 7 used to secure the bobbin 2 and core 1 is, as shown in FIGS. 32 and 33, applied to areas at the ends of the primary winding and secondary winding, and is a thermosetting adhesive made of a silicon material.

Compared with the epoxy adhesive, the silicon adhesive exhibits slightly low strength of adhesive bonding relative to the core. The silicon adhesive is therefore applied to wider areas.

The adhesive 5 is, like the one employed in the fifteenth embodiment, used to secure members constituting the core 1.

Owing to the foregoing structure, the same operation as that in the aforesaid embodiment is exerted to improve the anti-drop strength of the transformer.

Furthermore, the hardened silicon adhesive is softer than the normally-adopted epoxy adhesive that is hardened, and can be set to any hardness level. The cracking of the core or the peeling of the adhesive caused by a stress concentrated on the ferromagnetic core due to a cyclic change in temperature dependent on the use state of the transformer can be prevented (not shown because the structure is identical to the one shown in FIG. 30). In addition, there is the merit that an impact of a drop can be absorbed.

Figure 34:
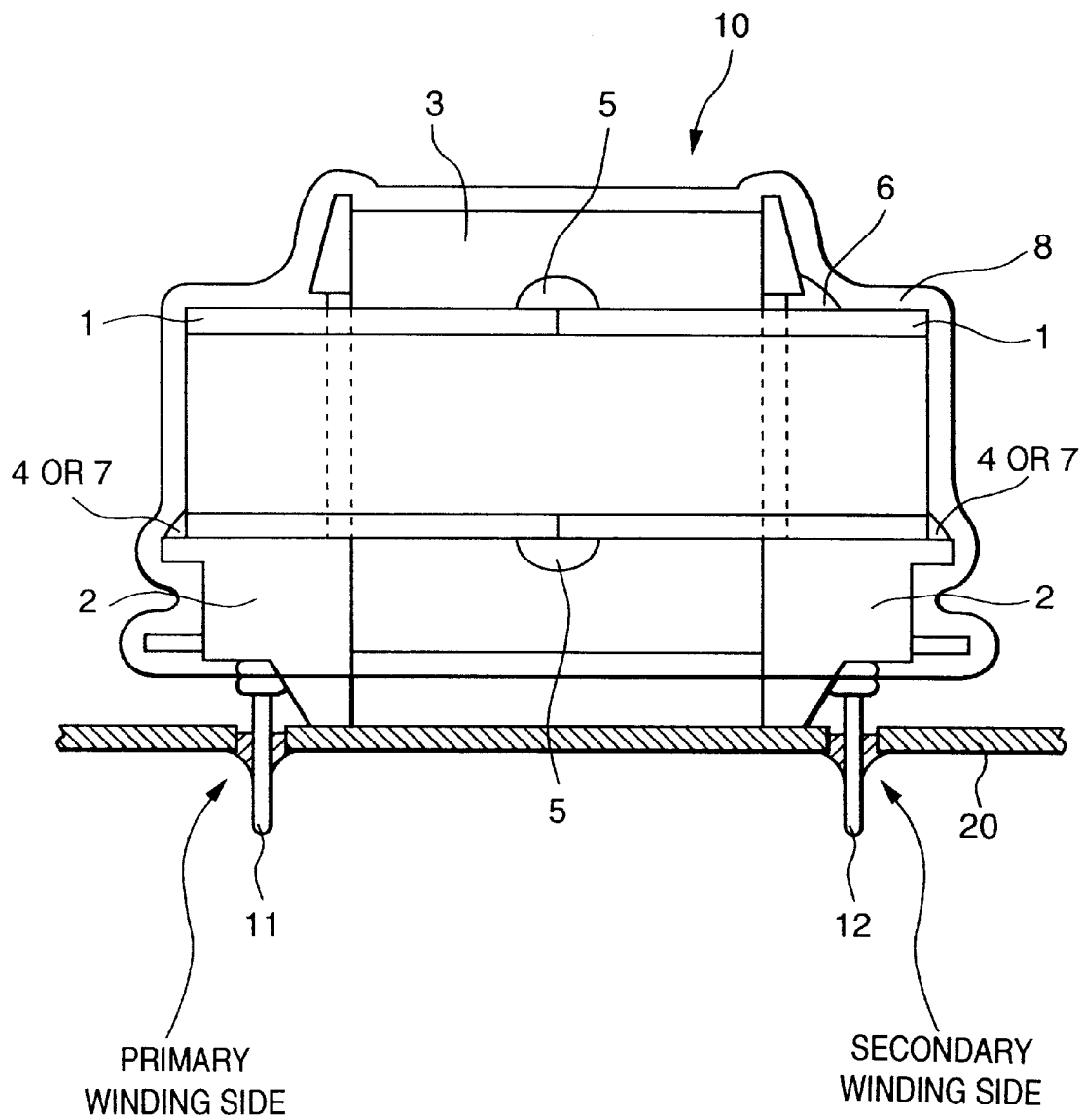
FIG. 34 is a front view showing the structure of a transformer in accordance with the seventeenth embodiment.

In the fifteenth embodiment, the same coefficient of linear expansion of the adhesive made of an epoxy material may be equalized with that of the ferromagnetic core, or an adhesive whose coefficient of linear expansion is approximated to a coefficient of linear expansion permitting prevention of cracking of the core deriving from a cyclic change in temperature dependent on the use state of the transformer may be employed. This makes it possible to prevent the cracking of the core or the peeling of the adhesives caused by a stress concentrated on the ferromagnetic core due to the cyclic change in temperature dependent on the use state of the transformer. FIG. 34 is a front view of a transformer in accordance with the seventeenth embodiment of the present invention.

Figure 17:
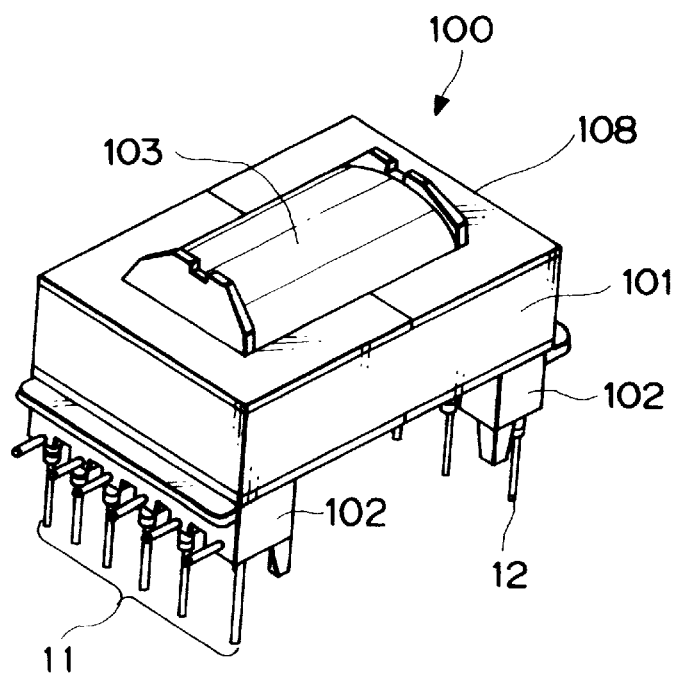
FIG. 17 is an oblique view of a transformer having a known structure.

In the drawing, the same reference numerals are assigned to the components that have been described. The description of the components will be omitted. The adhesives 4 and 7 used to secure the bobbin 2 and core 1 are, as shown in FIG. 17, applied to areas at the ends of the primary winding and secondary winding, and are thermosetting adhesives. The thermosetting adhesives may be made of either an epoxy material or silicon material.

After the affixing means used to secure the bobbin 2 and core 1 is applied, the transformer is impregnated with the varnish 8. The varnish 8 is then dried. Since the varnish 8 is dried at the temperature of about 120EC, the thermosetting adhesives remain hardened. This is advantageous.

Although a phenomenon that a transformer makes a sound at a natural frequency is likely to occur when fixation is attained using adhesives alone, the phenomenon will not take place owing to the foregoing structure. Moreover, since the varnish 8 permeates through the gaps between the core 1 and bobbin 2, the core and bobbin are affixed to each other on a planar basis. This provides the merit that the anti-drop strength of the transformer further improves.

An adhesive made of an incombustible material may be used as the adhesives employed in the aforesaid cases. A transformer using such an adhesive can be adopted not only for a mere DC-to-DC converter but also for a converter included in a switching power supply requested to meet safety standards. The use of the adhesive made of an incombustible material also has the merit that the safety of the transformer improves.

The descriptions of the embodiments are concerned with a transformer whose core is placed sideways. Needless to say, the present invention provides the same advantages even for a transformer whose core is placed lengthwise.

The transformer 10 having the foregoing structure was dropped off a desktop (approximately 75 cm high) to a floor seven times in the same direction. Nevertheless, the transformer was not ruptured.

According to the foregoing structure, a simple change should merely be made at a step of applying adhesives in the process of manufacturing a transformer, that is, the number of positions on the collars 2a to which the adhesives 4 and 7 are applied should merely be increased. This provides the merit that no special means or material is necessary.

Furthermore, the epoxy adhesive serving as the affixing means used to secure the bobbin 2 and core 1 is a thermosetting adhesive. Natural hardening is facilitated by heat dissipated due to self-heating occurring when the transformer in a power supply unit is actuated. Moreover, since the adhesive exhibits good thermal conductivity, the strength of adhesive bonding of the adhesive will, unlike that of a thermoplastic adhesive, not be degraded.

Moreover, since the adhesives 4 and 7 are used for fixation, a phenomenon that a transformer makes a sound at a natural frequency and is likely to occur will not take place. Besides, the varnish permeates through the gaps between the core and bobbin. The core and bobbin are therefore affixed to each other on a planar basis. This provides the merit that the anti-drop strength of the transformer further improves.

As described above, according to the present invention, there are provided a transformer assembling method, a transformer, and a transformer-mounted substrate in which the anti-breakdown strength of a transformer can be improved, the performance of a ferrite core can be drawn out fully, and the transformer can be designed to be compact and lightweight. Specifically, there is provided a transformer capable of resisting a drop and being produced in the on-going process of manufacturing a transformer without the use of any special component or material.

Figure 35:
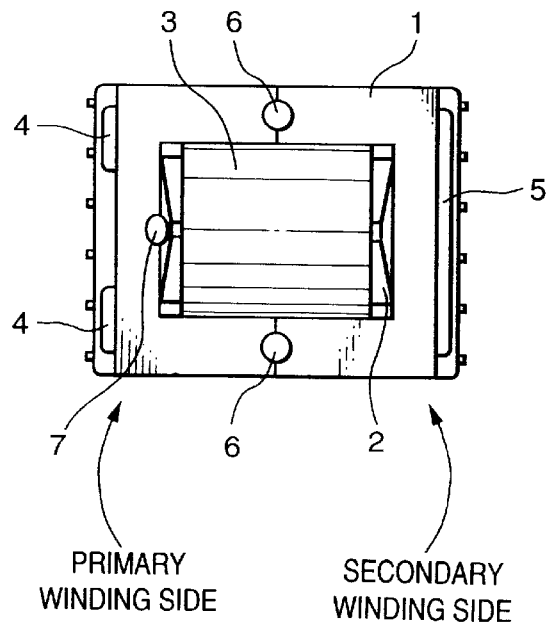
FIG. 35 is a plan view showing a transformer in accordance with the eighteenth embodiment.
Figure 36:
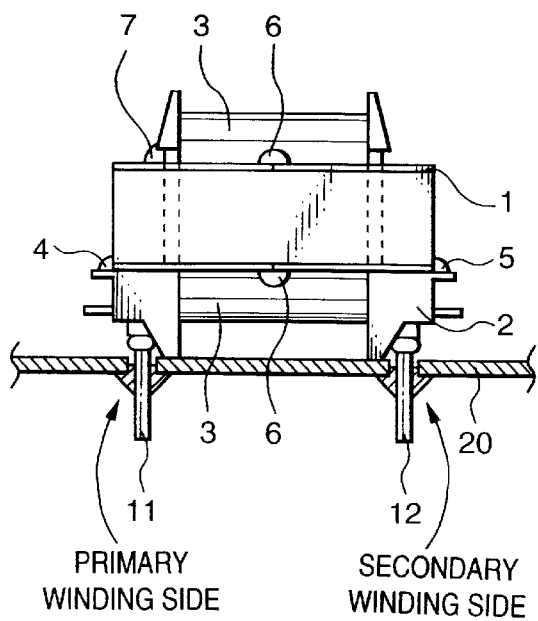
FIG. 36 is a front view of the transformer, which is shown in FIG. 35, mounted on a substrate 20.

FIG. 35 is a plan view showing the structure of a transformer in accordance with the eighteenth embodiment, and FIG. 36 is a front view of the structure shown in FIG. 35.

In FIGS. 35 and 36, a transformer employed in a switching power supply unit is, as illustrated, composed of a core 1 made of a ferrite, a bobbin about which a wound material is wound to form windings and which is made of a resin, and a winding member 3 made by winding the wound material used to form the windings, an inter-layer isolation tape, a barrier tape used to space the primary and secondary windings in order to meet safety standards, according to a given winding method. As shown in FIG. 2, the transformer is soldered and fixed to the substrate 20 with pins therefore inserted through holes bored in the substrate.

The adhesive 4 serving as an affixing means used to secure the bobbin 2 and core 1 is, as shown in FIGS. 35 and 36, applied to positions at the ends of the primary winding and secondary winding on the collars of the bobbin 2. An epoxy thermosetting adhesive is used as the adhesive 4.

The first adhesive and second adhesive used to secure the bobbin 2 and core 1 are the adhesive 4 applied to the primary winding fixture and the adhesive 5 applied to the secondary winding fixture. A thermosetting epoxy adhesive is used as the adhesive 4 applied to the primary winding.

The adhesive 5 applied to the secondary winding fixture is a thermosetting silicon adhesive. The hardened adhesive 4 is harder than the hardened adhesive 5. The strength of adhesive bonding between the ferromagnetic core 1 and bobbin 2 which is exerted by the silicon adhesive is little lower than that exerted by the epoxy adhesive. The silicon adhesive is therefore applied to wider areas. The adhesive 6 is used to secure members constituting the ferromagnetic core 1.

The adhesive 7 is an adhesive that has customarily been used to secure the ferromagnetic core 1 and bobbin 2 in the past. According to the present invention, the adhesive is not a must.

For example, as far as a known transformer is concerned, when the transformer is dropped off a desktop or when an excessive impact is applied to a power supply unit, a moment M or an excessive impact is concentrated on the transformer, which is heavier than the other components of the power supply unit, in a direction of an arrow shown in FIG. 43. The bobbin 2 fails to resist the moment or impact and is relatively readily ruptured near a portion thereof coupled with the winding member.

A drop test was conducted as one of various drop tests on a transformer whose core 1 and bobbin 2 were not secured. Since the core 1 and bobbin 2 were not secured, the core 1 was thought to crack. However, a crack occurred at the position shown in FIG. 43. This demonstrated that the anti-impact resistivity of the ferromagnetic core 1 was sufficient but the strength of the bobbin 2 made of a resin material was insufficient.

As a countermeasure, the adhesives 4 and 5 used to secure the bobbin 2 and core 1 are, as shown in FIGS. 35 and 36, applied to areas at the ends of the primary winding and secondary winding. When a drop test was conducted on the transformer having the bobbin 2 and core 1 secured in this way, the strength of adhesive bonding between the bobbin 2 and core 1 was apparently intensified. A breaking force was dispersed by distributing an moment M or impact deriving from a drop to the bobbin 2 and ferromagnetic core 1. Owing to the illustrated structure, the transformer becomes strong enough not to break down with a drop.

Moreover, the adhesives 4 and 5 employed have different hardness levels. Specifically, the silicon adhesive 5 that is softer is used to alleviate (absorb) a stress stemming from a difference in coefficient of linear expansion between the bobbin 2 and core 1. Occurrence of a crack of the core deriving from expansion or contraction due to a cyclic change in temperature can be prevented.

Furthermore, an epoxy adhesive and silicon adhesive used as the adhesives to secure the bobbin 2 and core 1 are of a thermosetting type. The adhesives are hardened with heat dissipated due to self-heating occurring when the transformer in a power supply unit is actuated. It will therefore not take place that the strength of adhesive bonding deteriorates because of softening. For this reason, the employment of the adhesives is preferable. Moreover, it is also preferable in terms of use practice.

Figure 37:
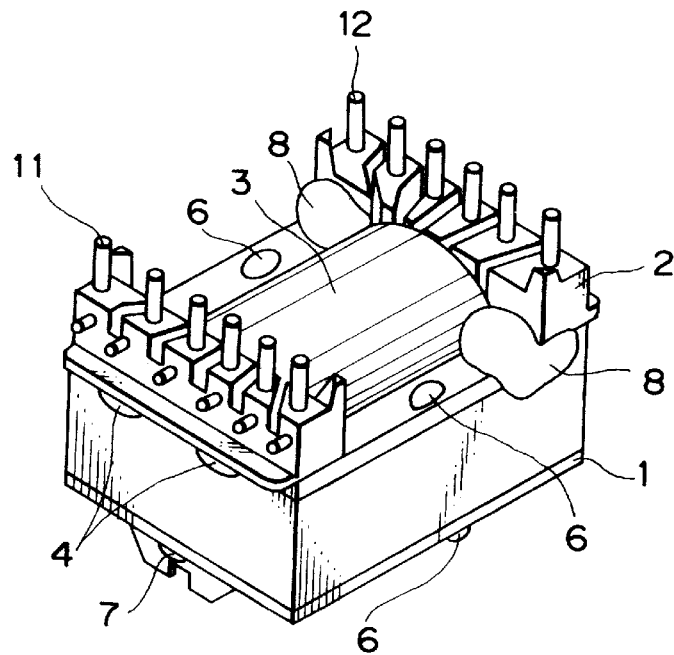
FIG. 37 is an oblique view showing a transformer in accordance with the nineteenth embodiment which is seen from the bottom thereof (the components-mounted surface of a substrate)
Figure 38:
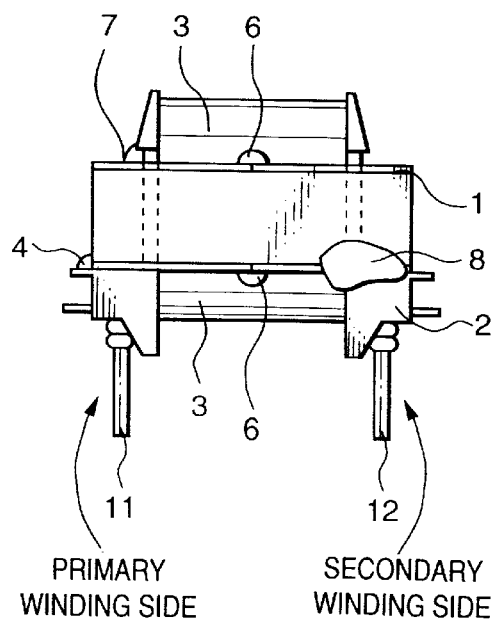
FIG. 38 is a front view of the transformer shown in FIG. 37.

FIG. 37 is an oblique view showing a transformer in accordance with the nineteenth embodiment of the present invention which is seen from the bottom thereof, and FIG. 38 is a front view of the transformer.

In the drawings, the same reference numerals are assigned to the components that have already been described. The description of the components will be omitted. The adhesive 6 is used to secure members constituting the ferromagnetic core 1. The adhesive 7 is an adhesive used to secure the core 1 and bobbin 2 and has no direct relation to the present invention (this does not mean that the adhesive 7 does not act as a reinforcement).

According to the eighteenth embodiment, the adhesive 5 applied to the secondary winding fixture in order to secure the bobbin 1 and core 2 is a thermosetting silicon adhesive. According to this embodiment, an adhesive 8 applied to the secondary winding fixture in order to secure the bobbin 2 and ferromagnetic core 1 is a thermoplastic hot-melt adhesive.

The adhesive 8 is, for example, an adhesive called Jet Melt No. 3748 and manufactured by Sumitomo 3M Co., Ltd. Since the adhesive 8 is a thermoplastic adhesive, it is moderately soft and can therefore alleviate an impact deriving from a drop.

Moreover, the adhesive 8 is, as illustrated, applied to junctions between the bobbin 2 and one winding 3 so that the adhesive will face the components-mounted surface of a substrate.

When a transformer is structured as shown in FIGS. 37 and 38, the sufficient strength against a drop can be maintained. Moreover, the fear that the core cracks because of a difference in coefficient of linear expansion will be canceled. In addition to the advantage provided by the first embodiment, there is the merit in practice that since the adhesive 8 can be applied afterward to a transformer purchased as a normal component, an existing transformer can be used.

Figure 39:
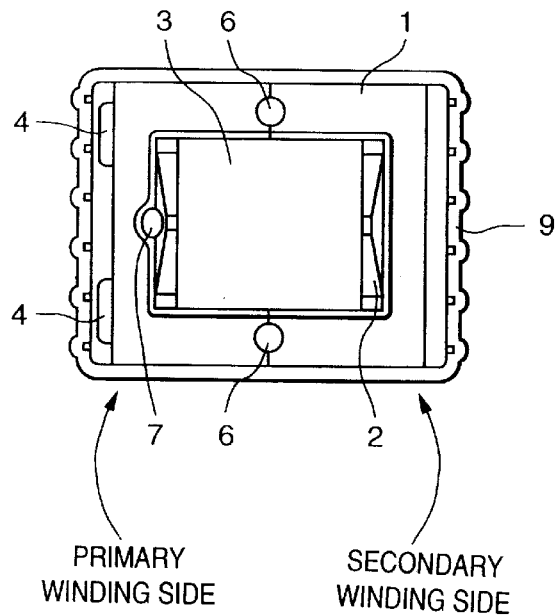
FIG. 39 is a plan view of a transformer in accordance with the twentieth embodiment.
Figure 40:
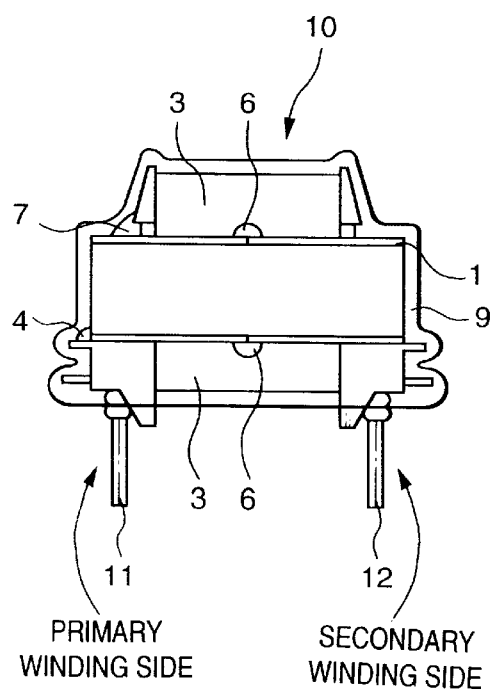
FIG. 40 is a front view of the transformer shown in FIG. 39.

FIG. 39 is a plan view showing the structure of a transformer in accordance with the twentieth embodiment, and FIG. 40 is a front view showing the structure of the transformer mounted on a substrate.

In this embodiment, the same reference numerals are assigned to the components that have already been described. The description of the components will be omitted. The basic structure of a transformer is identical to the aforesaid one.

As for adhesives used to secure the bobbin 2 and ferromagnetic core 1, the adhesive 4 applied to the primary winding fixture is, as shown in FIGS. 39 and 40, a thermosetting epoxy adhesive. A varnish 9 with which the transformer is impregnated is used as an affixing means to be applied to the secondary winding fixture.

In this case, the density of the varnish 9 employed is adjusted and managed so that the varnish can permeate through the gaps between the bobbin 2 and ferromagnetic core 1 and a certain amount of varnish can adhere to the bobbin and core.

Normally, there is a "play" between the ferromagnetic core 1 and bobbin 2 in terms of dimensions. After the core 1 is attached to the bobbin 2, the transformer is impregnated with a varnish. At this time, if the transformer is placed upside down, little gaps are created between the bobbin 2 and core 1 due to the weight of the ferromagnetic core 1. The varnish 9 permeates through the gaps, whereby the bobbin 2 and core 1 is affixed firmly to each other.

According to the twentieth embodiment, like the other embodiments, a countermeasure against a drop can be taken, and the fear that the core may crack because of a difference in coefficient of linear expansion will be eliminated.

According to the twentieth embodiment, unlike the eighteenth and nineteenth embodiments, the varnish 9 permeates through the gaps between the core 1 and bobbin 2. The core and bobbin are therefore affixed to each other on a planar basis. Although a phenomenon that a transformer makes a sound at a natural frequency is likely to occur when fixation is attained using adhesives alone, the phenomenon will not take place. A countermeasure against a drop can be taken inexpensively.

Figure 41:
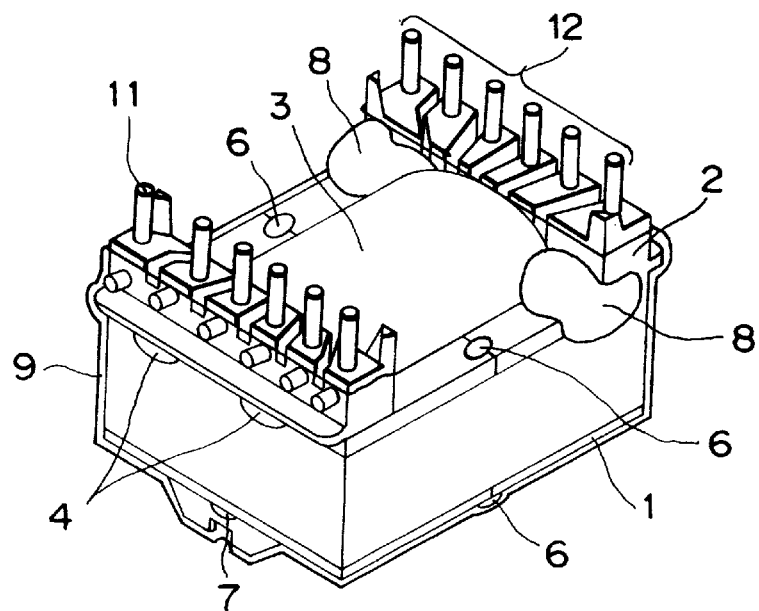
FIG. 41 is an oblique view of a transformer in accordance with the twenty-first embodiment which is seen from the bottom thereof.
Figure 42:
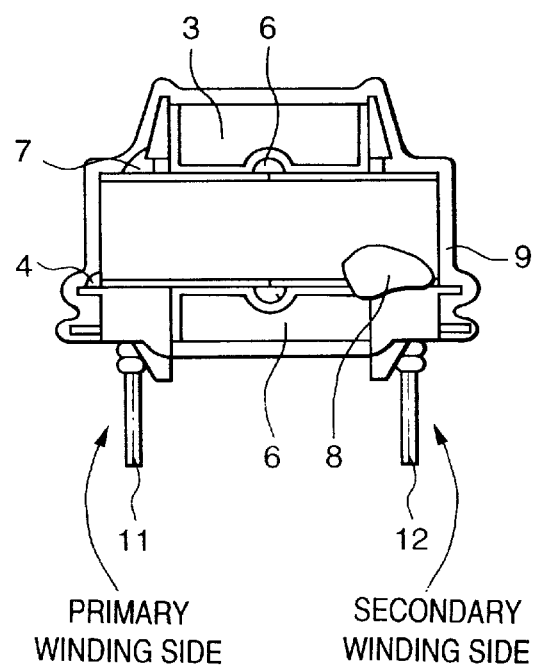
FIG. 42 is a front view of the transformer shown in FIG. 41.

FIG. 41 is an oblique view showing a transformer in accordance with the twenty-first embodiment which is seen from the bottom thereof, and FIG. 42 is a front view showing the structure.

In this embodiment, the same reference numerals are assigned to the components that have already been described. The description of the components will be omitted. The basic structure of a transformer has the constituent features provided by both the nineteenth and twentieth embodiments.

To be more specific, the adhesive 4 applied to the primary winding fixture is a thermosetting epoxy adhesive. The varnish 9 with which the transformer is impregnated is used as an affixing means to be applied to the secondary winding fixture. The hot-melt adhesive 8 that is a thermoplastic adhesive is applied to the varnish 9 and then solidified.

After the transformer is impregnated with the varnish, the adhesive 8 that is a hot-melt adhesive (for example, Jet Melt No. 3748 manufactured by Sumitomo 3M Co., Ltd.) is applied to a portion of the transformer that is not secured with the epoxy adhesive.

The transformer having the foregoing structure was dropped off a desktop (approximately 75 cm high) to a floor seven times in the same direction. Nevertheless, the transformer was not ruptured. The structure has the merit that sufficient strength of adhesive bonding can be exerted.

The aforesaid embodiments are concerned with a transformer whose core is placed sideways. The present invention can apply to a transformer whose core is placed lengthwise.

The primary winding fixture and secondary winding fixture to which the adhesives 4 and 5 are applied may be switched. The same advantage can still be provided.

Figure 47:
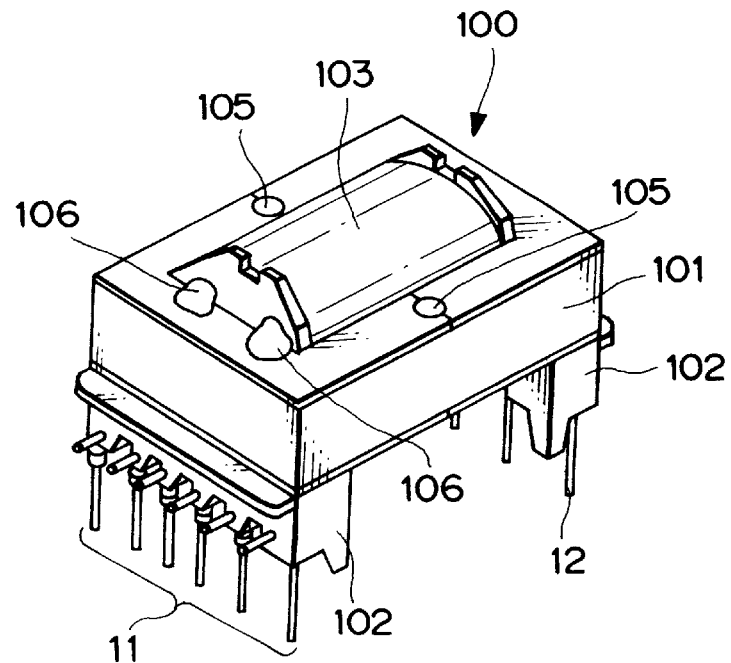
FIG. 47 is an oblique view showing the appearance of a known transformer.
Figure 48:
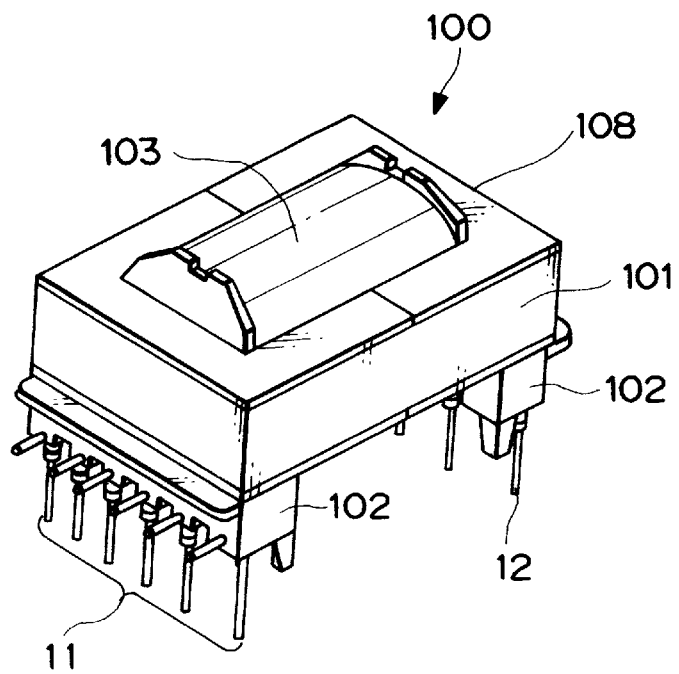
FIG. 48 is an oblique view showing the appearance of a known transformer, showing that transformer is fixed by different way from FIG. 47.

Furthermore, the structure may be adapted to the known transformers described in conjunction with FIGS. 47 and 48. The same advantage can still be provided.

As mentioned above, the adhesive applied to the primary winding fixture and the adhesive applied to the secondary winding fixture have mutually different hardness levels. The bobbin can therefore be prevented from cracking due to a cyclic change in temperature of the transformer occurring when the transformer is actuated for power supply. The core can be fixed to the bobbin on both sides of the transformer. The transformer can therefore exert sufficient anti-drop strength.

Moreover, the adhesives having mutually different hardness levels are thermosetting adhesives. In the process of manufacturing a transformer, the adhesives can be hardened at the same step.

Moreover, one of the adhesives having mutually different hardness levels is an epoxy adhesive widely adopted, and the other adhesive is a silicon adhesive widely adopted. The adhesives are therefore readily available. This leads to the merit that great freedom is ensured in selection of adhesives meeting the safety standards for a power transformer, for example, the standard of the UL standards stipulating an incombustible material.

Moreover, one of the adhesives having mutually different hardness levels is a thermosetting epoxy adhesive and the other adhesive is a thermoplastic hot-melt adhesive. The adhesives can be, if necessary, applied afterward to a transformer purchased as a normal component in the assembling process for a power supply. There is therefore the merit that an existing transformer can be used as it is.

Moreover, the hot-melt adhesive is made of a material that has been employed in the past. The adhesive can be used readily with safe in the course of a production line. Besides, one of the adhesives having mutually different hardness levels is an epoxy adhesive and the other is the varnish with which the transformer is impregnated and which serves as an affixing means. When the varnish permeates through the gaps between the core and bobbin, the core and bobbin are affixed to each other on a planar basis. Although a phenomenon that a transformer makes a sound at a natural frequency is likely to occur when fixation is attained using adhesives alone, the phenomenon will not take place. This provides the merit that a countermeasure against a drop can be taken inexpensively.

After the transformer is impregnated with the varnish, the hot-melt adhesive is applied to a portion of the transformer which is not secured with the epoxy adhesive. This provides the merit that the anti-drop strength of the transformer is further intensified.

As described so far, according to the present invention, there are provided a transformer assembling method, a transformer, and a transformer-mounted substrate in which the anti-breakdown strength of a transformer can be improved while the strength thereof against a drop is intensified, the performance of a ferrite core can be drawn out fully, the transformer can be designed to be compact and lightweight, and the core of the transformer can be protected from cracking due to a cyclic change in temperature of the transformer occurring when the transformer is actuated for power supply.

The present invention is not limited to the above embodiments and various changes and modifications can be made within the spirit and scope of the present invention. Therefore, to apprise the public of the scope of the present invention the following claims are made.

What is claimed is:

1. A transformer assembling method for producing a transformer by assembling a bobbin formed by uniting a winding member, which has a primary winding and secondary winding and a bore formed thereon and therein, with a primary winding fixture and a secondary winding fixture adjoining the openings of said bore, and a ferromagnetic core having a core portion thereof inserted into said bore and including an enclosure for enclosing said windings, said method comprising the step of:

affixing, using a thermoplastic adhesive, outer circumferences of the windings to the ferromagnetic core and affixing the primary winding fixture and secondary winding fixture of the bobbin to the ferromagnetic core, wherein in the affixing step, the thermoplastic adhesive is applied to valleys formed between the outer circumferences of the windings and the ferromagnetic core, and to areas linking the outer surfaces of the primary winding fixture and secondary winding fixture and outer surfaces of the ferromagnetic core.

2. A transformer assembling method according to claim 1, further comprising the step of impregnating the transformer with an impregnation material such as a varnish.

3. A transformer assembling method according to claim 1, wherein a hot-melt adhesive including an adhesive made of a polypropylene resin is used as the thermoplastic adhesive.

4. A transformer assembling method according to claim 1, wherein in the affixing step, the thermoplastic adhesive is applied to four corners formed among the outer circumferences of the windings, the ferromagnetic core, and the inner surfaces of the primary winding fixture and secondary winding fixture which are opposed to each other.

5. A transformer assembling method according to claim 1, wherein in the affixing step, the thermoplastic adhesive is applied to to regions adjoining the valleys between the inner surfaces of the primary winding fixture and secondary winding fixture which are opposed to each other and the outer circumferences of the windings.

6. A transformer, comprising:

a bobbin formed by uniting a winding member, which has a primary winding and secondary winding and a bore formed thereon and therein, with a primary winding fixture and secondary winding fixture adjoining the openings of said bore, and a ferromagnetic core having a core portion thereof inserted into said bore and including an enclosure for enclosing said windings; and a thermoplastic adhesive used to affix outer circumferences of said windings to said ferromagnetic core, and to affix said primary winding fixture and secondary winding fixture of said bobbin to said ferromagnetic core, wherein said thermoplastic adhesive is applied to valleys formed between said outer circumferences of said windings and said ferromagnetic core, and to areas linking outer surfaces of said primary winding fixture and secondary winding fixture and outer surfaces of said ferromagnetic core.

7. A transformer according to claim 6, wherein said transformer is impregnated with an impregnation material such as a varnish.

8. A transformer according to claim 6, wherein a hot-melt adhesive including an adhesive made of a polypropylene resin is used as said thermoplastic adhesive.

9. A transformer according to claim 6, wherein said thermoplastic adhesive is applied to four corners formed among the outer circumferences of said windings, said ferromagnetic core, and the inner surfaces of said primary winding fixture and secondary winding fixture which are opposed to each other.

10. A transformer according to claim 6, wherein said thermoplastic adhesive is applied to regions adjoining said valleys between the inner surfaces of said primary winding fixture and secondary winding fixture which are opposed to each other and the outer circumferences of said windings.

11. A transformer-mounted substrate, comprising:
- a substrate on which is mounted a transformer including a bobbin formed by uniting a winding member, which has a primary winding and secondary winding and a bore formed thereon and therein, with a primary winding fixture and secondary winding fixture adjoining the openings of said bore, and a ferromagnetic core having a core portion thereof inserted into said bore and including an enclosure for enclosing said windings; and
- a thermoplastic adhesive used to affix the outer circumferences of said windings to said ferromagnetic core, and to affix said primary winding fixture and secondary winding fixture of said bobbin to said ferromagnetic core, wherein said thermoplastic adhesive is applied to valleys formed between said outer circumferences of said windings and said ferromagnetic core, and to areas linking the outer surfaces of said primary winding fixture and secondary winding fixture and the outer surfaces of said ferromagnetic core.

12. A transformer-mounted substrate according to claim 11, wherein said transformer is impregnated with an impregnation material such as a varnish.

13. A transformer-mounted substrate according to claim 11, wherein a hot-melt adhesive including an adhesive made of a polypropylene resin is used as said thermoplastic adhesive.

14. A transformer-mounted substrate according to claim 11, wherein said thermoplastic adhesive is applied to four corners formed among the outer circumferences of said windings, said ferromagnetic core, and the inner surfaces of said primary winding fixture and secondary winding fixture which are opposed to each other.

15. A transformer-mounted substrate according to claim 11, wherein said thermoplastic adhesive is applied to regions adjoining said valleys between the inner surfaces of said primary winding fixture and secondary winding fixture which are opposed to each other.

16. A transformer-mounted substrate according to claim 11, wherein said components-mounted substrate is a substrate for a power supply to be incorporated in equipment.

* * * * *

UNITED STATES PATENT AND TRADEMARK OFFICE
CERTIFICATE OF CORRECTION

PATENT NO. : 6,144,278
DATED : November 7, 2000
INVENTOR(S) : Hideyuki Nishida et al.

It is certified that error appears in the above-identified patent and that said Letters Patent is hereby corrected as shown below:

Column 2,
Line 15, "whose" should read -- whole --

Column 11,
Line 58, "Fl" should read -- F1 --.

Column 17,
Line 38, "120-C," should read -- 120°C, --.

Column 22,
Line 28, "Jet-melt" should read -- Jet-Melt --.
Line 39, "lb" should read -- 1b --.

Column 23,
Line 3, "la" should read -- 1a --.

Column 24,
Line 9, "lb" should read -- 1b --.
Line 12, "la" should read -- 1a --.
Line 21, "la" should read -- 1a --.

Column 27,
Line 25, "120EC," should read -- 120°C, --.

Column 28,
Line 61, "or" should read -- of --.

Column 29,
Line 30, "use practice." should read -- use. --.

UNITED STATES PATENT AND TRADEMARK OFFICE
CERTIFICATE OF CORRECTION

PATENT NO. : 6,144,278
DATED : November 7, 2000
INVENTOR(S) : Hideyuki Nishida et al.

It is certified that error appears in the above-identified patent and that said Letters Patent is hereby corrected as shown below:

Column 32,
Line 44, "to to" should read -- to --.

Signed and Sealed this

Twenty-third Day of October, 2001

Attest:

*Attesting Officer*

NICHOLAS P. GODICI
*Acting Director of the United States Patent and Trademark Office*